(12) United States Patent
Hong et al.

(10) Patent No.: US 12,464,922 B2
(45) Date of Patent: Nov. 4, 2025

(54) COLOR CONVERSION SUBSTRATE, DISPLAY DEVICE AND METHOD OF MANUFACTURING COLOR CONVERSION SUBSTRATE

(71) Applicant: Samsung Display Co., Ltd., Yongin-Si (KR)

(72) Inventors: Seok-Joon Hong, Seongnam-si (KR); Jang-Il Kim, Asan-si (KR); Jeaheon Ahn, Hwaseong-si (KR); Myoungjong Lee, Cheonan-si (KR); Seongyeon Lee, Asan-si (KR); Si-Wan Jeon, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 724 days.

(21) Appl. No.: 17/475,792

(22) Filed: Sep. 15, 2021

(65) Prior Publication Data
US 2022/0208859 A1    Jun. 30, 2022

(30) Foreign Application Priority Data
Dec. 28, 2020 (KR) .................. 10-2020-0184800

(51) Int. Cl.
*H10K 59/38* (2023.01)
(52) U.S. Cl.
CPC .................................. *H10K 59/38* (2023.02)
(58) Field of Classification Search
CPC .... H10K 59/50; H10K 50/813; H10K 50/858; H10K 50/86; H10K 59/124; H10K 59/351; H10K 59/38; C09D 11/326; C09D 11/36; G02F 1/133516; G02B 5/223
See application file for complete search history.

(56) References Cited

U.S. PATENT DOCUMENTS

| | | | |
|---|---|---|---|
| 2009/0086353 A1* | 4/2009 | Tsai ................. | G02F 1/133516 359/896 |
| 2009/0135349 A1* | 5/2009 | Shibatani ............. | C09D 11/326 524/588 |
| 2012/0032151 A1* | 2/2012 | Hama ................... | H10K 50/13 252/586 |
| 2012/0098414 A1 | 4/2012 | Nakamura | |

(Continued)

FOREIGN PATENT DOCUMENTS

| | | |
|---|---|---|
| CN | 107658326 A | 2/2018 |
| EP | 4016637 A1 | 6/2022 |

(Continued)

OTHER PUBLICATIONS

Extended European Search Report for Application No. 21207612.9-1211 dated Apr. 20, 2022 enumerating the above listed references.

(Continued)

*Primary Examiner* — Brook Kebede
(74) *Attorney, Agent, or Firm* — CANTOR COLBURN LLP

(57) ABSTRACT

A color conversion substrate includes: a bank defining a first opening area and a second opening area; a conversion part disposed in the first opening area and including a color conversion particle; and a partition wall disposed in the second opening area and dividing the second opening area into a plurality of sub-opening areas.

20 Claims, 17 Drawing Sheets

(56) References Cited

U.S. PATENT DOCUMENTS

| | | | |
|---|---|---|---|
| 2012/0146062 A1* | 6/2012 | Oda | H10K 50/18 |
| | | | 257/E33.044 |
| 2016/0252812 A1* | 9/2016 | Yamada | G03F 7/0388 |
| | | | 257/40 |
| 2019/0212610 A1 | 7/2019 | Kim et al. | |
| 2020/0110303 A1 | 4/2020 | Lee et al. | |
| 2020/0212109 A1 | 7/2020 | Lee et al. | |
| 2020/0258945 A1 | 8/2020 | Joo et al. | |
| 2020/0326586 A1 | 10/2020 | Kim et al. | |
| 2020/0373359 A1 | 11/2020 | Lee et al. | |
| 2022/0199690 A1 | 6/2022 | Lee et al. | |

FOREIGN PATENT DOCUMENTS

| | | |
|---|---|---|
| JP | 2013109907 A | 6/2013 |
| KR | 1020160124301 A | 10/2016 |
| KR | 20200083745 A | 7/2020 |
| KR | 20200097380 A | 8/2020 |
| KR | 20200120793 A | 10/2020 |
| KR | 1020200117093 A | 10/2020 |
| KR | 20200135130 A | 12/2020 |

OTHER PUBLICATIONS

Office Action mailed Oct. 21, 2024 in EP Application No. 21 207 612.9, 13 pages.

\* cited by examiner

COLOR CONVERSION SUBSTRATE, DISPLAY DEVICE AND METHOD OF MANUFACTURING COLOR CONVERSION SUBSTRATE

This application claims priority to Korean Patent Application No. 10-2020-0184800 filed on Dec. 28, 2020, and all the benefits accruing therefrom under 35 U.S.C. § 119, the content of which in its entirety is herein incorporated by reference.

BACKGROUND

1. Field

Embodiments relate to a display device. More specifically, embodiments relate to a color conversion substrate, a display device including the color conversion substrate, and a method of manufacturing the color conversion substrate.

2. Description of the Related Art

A display device is a device that displays an image for providing visual information to a user. Among display devices, an organic light emitting display device has recently attracted attention.

The organic light emitting display device includes an array substrate and a color conversion substrate. In order to form the color conversion layer, an ink may be provided through an inkjet process.

SUMMARY

However, when the color conversion substrate is formed by using the inkjet process, the ink may not drop into an opening area of the bank and may be erroneously deposited on the bank. A second opening area adjacent to the first opening area may be formed to prevent an ink from misplacement. In this case, a bank between the first and second opening areas may be lost during the manufacturing process of the display device. When the bank is lost, an ink accommodated in the first opening area may flow out toward the second opening area. When the amount of the ink is large, dark spots may occur in the display device.

Embodiments provide a color conversion substrate with an improved dark spot defect.

Embodiments provide a display device with an improved dark spot defect.

Embodiments provide a method of manufacturing a color conversion substrate with an improved dark spot defect.

A color conversion substrate according to an embodiment includes a bank defining a first opening area and a second opening area; a conversion part disposed in the first opening area and including a color conversion particle; and a partition wall disposed in the second opening area and dividing the second opening area into a plurality of sub-opening areas.

In an embodiment, each of the plurality of sub-opening areas may have a volume smaller than a volume of the first opening area.

In an embodiment, the partition wall may include a same material as the bank.

In an embodiment, the second opening area may be adjacent to a first surface of the first opening area.

In an embodiment, the partition wall may have a shape of one of a straight shape, a curved shape, and a bent shape.

In an embodiment, the partition wall may include a first partition wall and a second partition wall.

In an embodiment, the first partition wall and the second partition wall may have straight shapes and the first partition wall and the second partition wall may extend in a first direction, and may be spaced apart from each other in a second direction perpendicular to the first direction.

In an embodiment, the first partition wall and the second partition wall may have straight shapes, and the first partition wall and the second partition wall may cross each other.

In an embodiment, the first partition wall and the second partition wall may have curved shapes, and the first partition wall may be adjacent to a first surface of the second opening area, and the second partition wall may be adjacent to a second surface opposite to the first surface.

In an embodiment, the partition wall may be arranged in a lattice structure.

In an embodiment, the color conversion substrate may further include a spacer disposed on the bank.

In an embodiment, a portion of the bank disposed between the first opening area and the second opening area may have a width smaller than a width of the spacer.

In an embodiment, the partition wall may have a width smaller than a width of the spacer.

A display device according to an embodiment includes a color conversion substrate including a bank, a color conversion unit and a partition wall, where the bank defines a first opening area and a second opening area, the color conversion unit is disposed in the first opening area and includes a color conversion particle, and the partition wall is disposed in the second opening area and divides the second opening area into a plurality of sub-opening areas; and an array substrate coupled to the color conversion substrate, and including a light emitting diode which provides a light to the color conversion substrate.

In an embodiment, each of the plurality of sub-opening areas may have a volume smaller than a volume of the first opening area.

In an embodiment, the partition wall may include a first partition wall and a second partition wall, the first partition wall and the second partition wall may have straight shapes, and the first partition wall and the second partition wall may extend in a first direction, and may be spaced apart from each other in a second direction perpendicular to the first direction.

In an embodiment, the display device may further include a spacer disposed on the bank, and a portion of the bank disposed between the first opening area and the second opening area may have a width smaller than a width of the spacer.

In an embodiment, the partition wall may have a width smaller than the width of the spacer.

A method of manufacturing a color conversion substrate according to an embodiment may include: forming a bank with a partition wall, where the bank defines a first opening area and a second opening area adjacent to the first opening area, the partition wall is disposed in the second opening area and divides the second opening area into a plurality of sub-opening areas; providing an ink in the first opening area; and forming a color conversion unit by curing the ink.

In an embodiment, each of the plurality of the sub-opening areas may have a volume smaller than a volume of the first opening area.

In an embodiment, the partition wall may include a first partition wall and a second partition wall, and the first partition wall and the second partition wall each may have a shape of one of a straight shape, a curved shape, and a bent shape.

In an embodiment, the color conversion unit may be formed by an inkjet process.

In an embodiment, the method may further include forming a spacer on the bank, and a width of a portion of the bank formed between the first opening area and the second opening area may be smaller than a width of the spacer.

In a color conversion substrate according to embodiments of the present invention, a first opening area and a second opening area may be disposed in a bank. A color conversion unit may be disposed in the first opening area. The color conversion unit may be formed by an inkjet process, and ink may be provided to the first opening area when the inkjet process is performed. At least one partition wall may be disposed in the second opening area to divide the second opening area into a plurality of areas. The plurality of areas may accommodate misplaced ink, thereby a gap defect may be effectively prevented.

In addition, the plurality of areas may accommodate the ink flowing out from the first opening area when a bank between the first opening area and the second opening area is lost. By the plurality of areas accommodating the ink, the amount of the leaked ink may be kept small. Accordingly, a thickness of the color conversion unit disposed in the first opening area can be kept constant. Accordingly, dark spots occurring in the display device may be effectively prevented.

DETAILED DESCRIPTION

Figure 1:
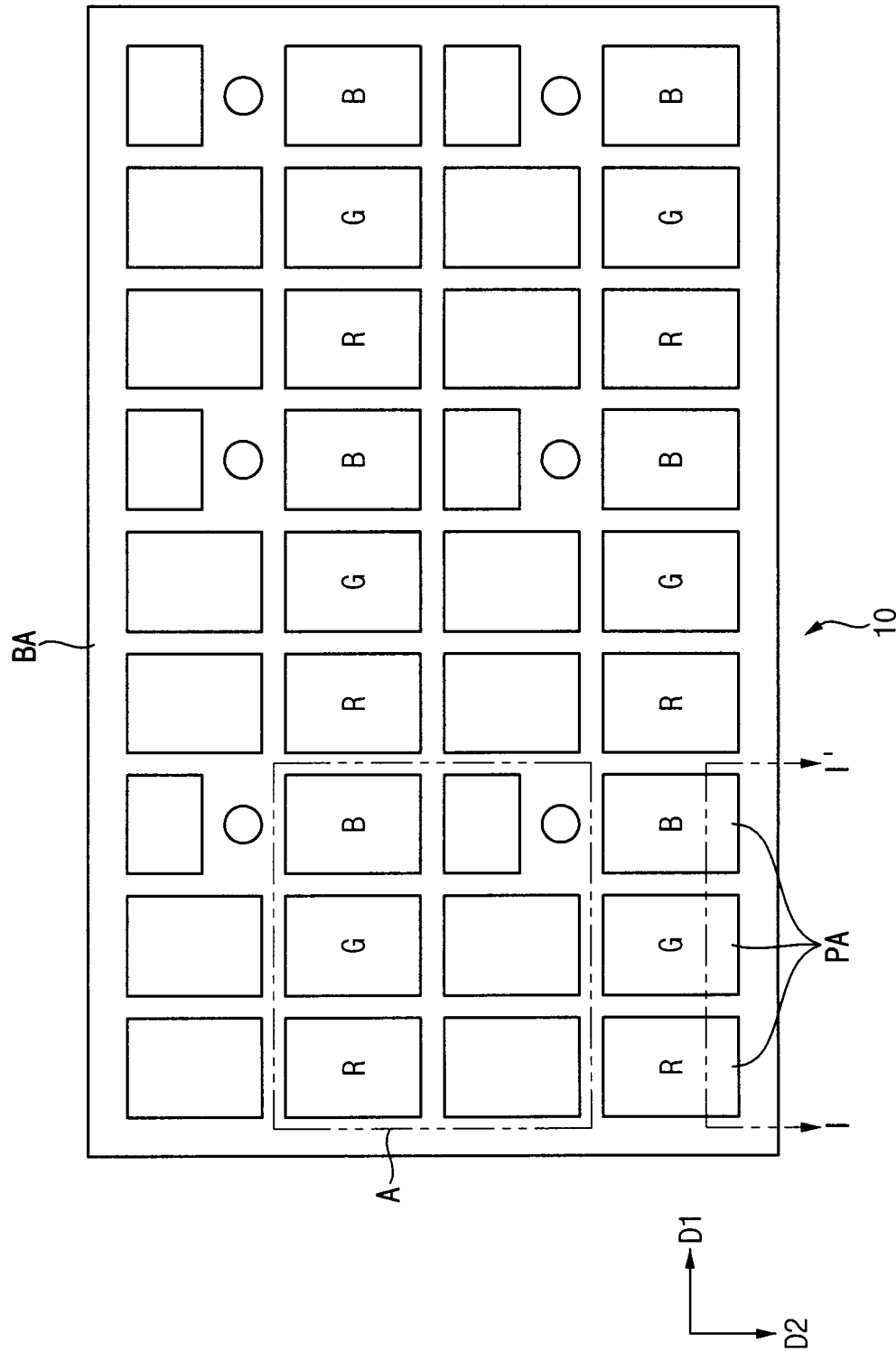
FIG. 1 is a plan view illustrating a display device according to an embodiment of a present invention.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Hereinafter, display devices in accordance with embodiments will be described in more detail with reference to the accompanying drawings. The same reference numerals are used for the same configurations in the drawings, and redundant descriptions of the same configurations will be omitted.

Figure 2:
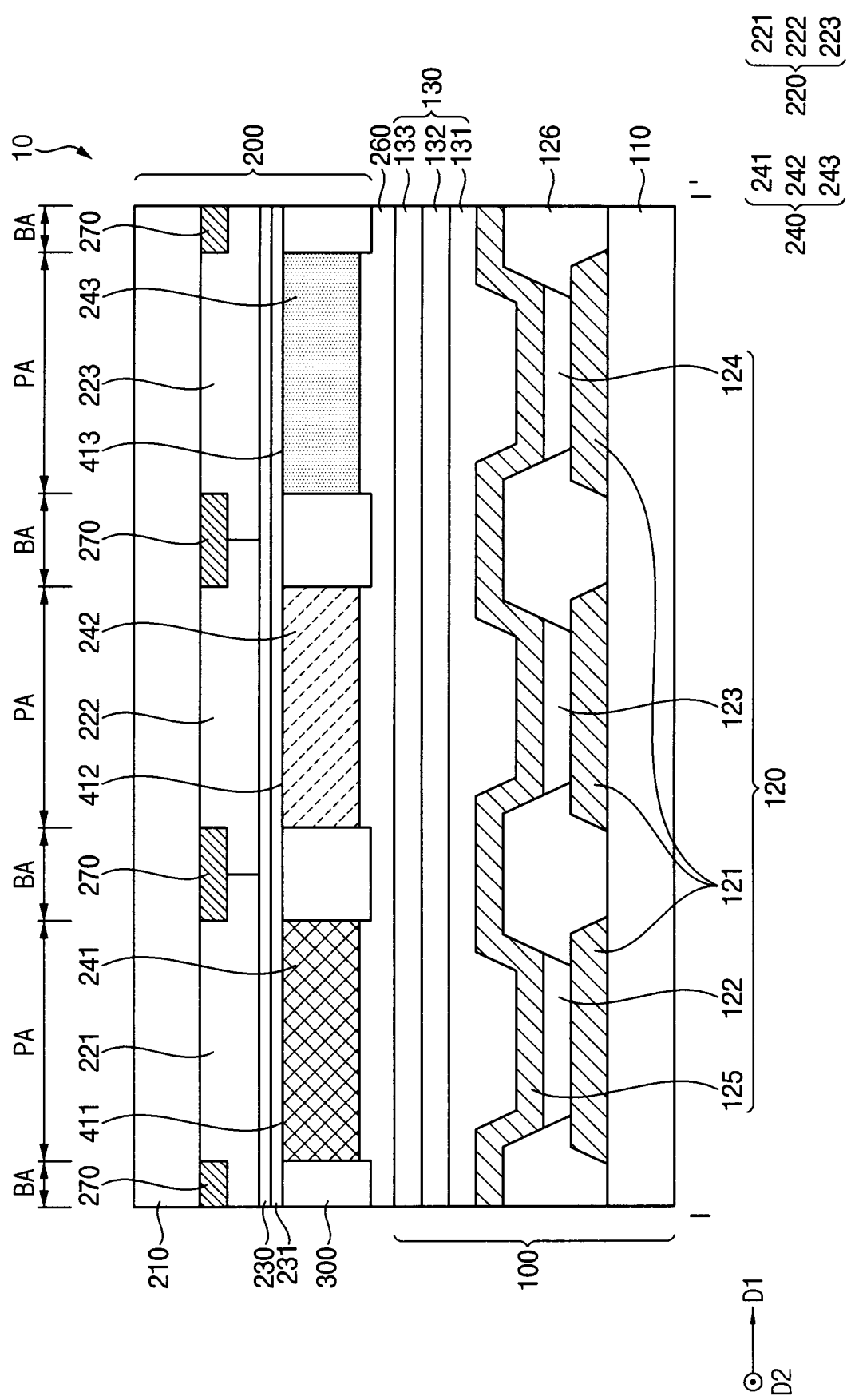
FIG. 2 is a cross-sectional view taken along line I-I' of FIG. 1.
Figure 3:
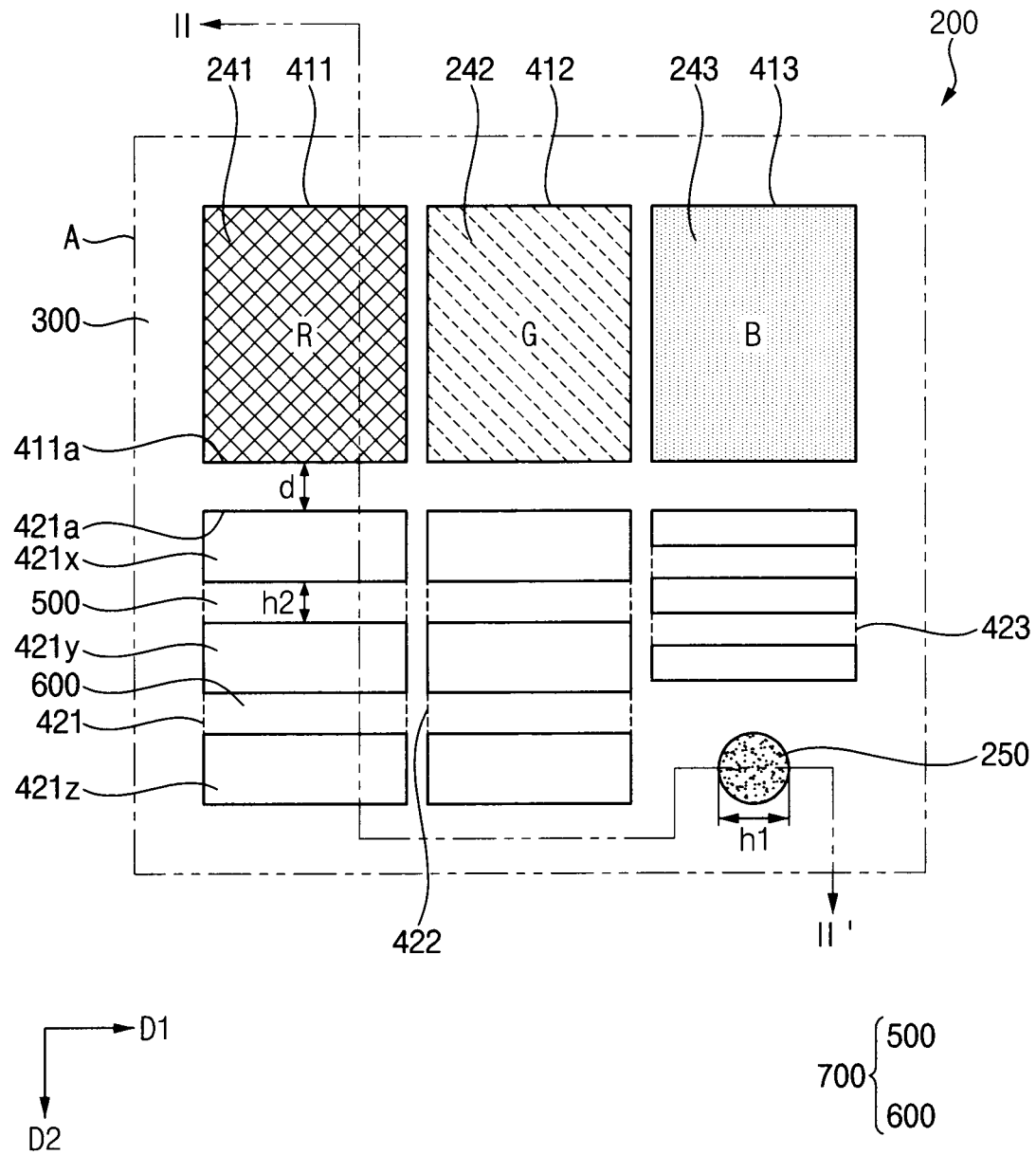
FIG. 3 is an enlarged view of an area A of FIG. 1.
Figure 4:
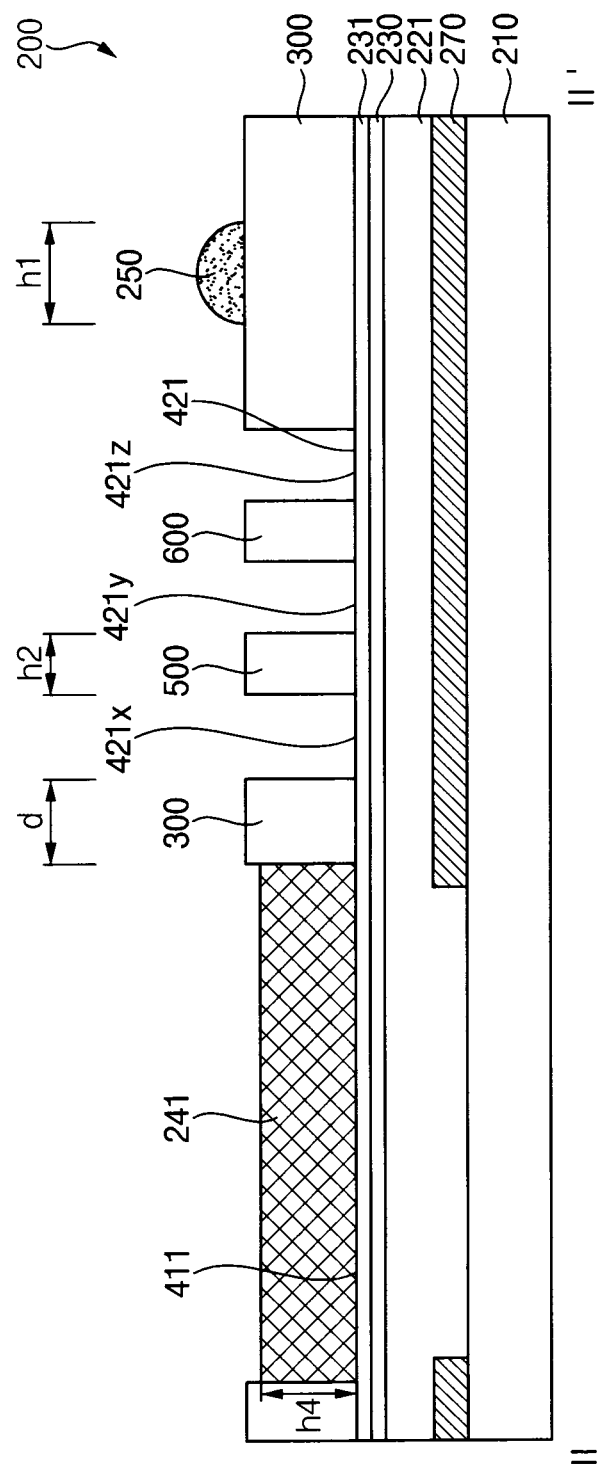
FIG. 4 is a cross-sectional view taken along line II-II' of FIG. 3.

FIG. 1 is a plan view illustrating a display device according to an embodiment of a present invention. FIG. 2 is a cross-sectional view taken along line I-I' of FIG. 1. FIG. 3 is an enlarged view of an area A of FIG. 1. FIG. 4 is a cross-sectional view taken along line II-II' of FIG. 3.

Referring to FIGS. 1 and 2, a display device 10 may include pixel areas PA and a light blocking area BA. The pixel areas PA may be areas in which light is emitted and may be surrounded by the light blocking area BA. In embodiments, the pixel areas PA may be arranged in a matrix form. In addition, in embodiments, three pixel areas PA may be disposed in an area A (See FIG. 1), and the area A may be repeated in first and second directions D1 and D2 of the display device 10. An arrangement of the pixel areas PA shown in FIG. 1 is exemplary, and the present invention is not limited thereto. The pixel areas PA may be arranged in various shapes corresponding to an arrangement of a light emitting diode 120 of the display device 10.

The light blocking area BA may surround the pixel areas PA. The light blocking area BA is an area from which the light is not emitted, may be disposed between the plurality of the pixel areas PA, and may have a mesh shape. A driver (not shown) for driving the pixel areas PA may be disposed in the light blocking area BA. The driver may include a scan driver, a data driver, a light emitting driver, a signal controller, or the like.

The display device 10 may include a color conversion substrate 200, an array substrate 100, and a filling layer 260 between the color conversion substrate 200 and the array substrate 100. The array substrate 100 may include a lower substrate 110, the light emitting diode 120, a pixel defining layer 126, and an encapsulation layer 130.

The lower substrate 110 may include an insulating substrate. The insulating substrate may be a rigid substrate or a flexible substrate. The insulating substrate may include glass, quartz, polymer resin, plastic, or the like. For example, the polymer resin may include polyimide, polyacrylate, polycarbonate, or a combination thereof.

The lower substrate 110 may further include other structures disposed on the insulating substrate. For example, the lower substrate 110 may further include a wiring, an electrode, an insulating layer, or the like. In addition, the lower substrate 110 may further include a plurality of thin film transistors disposed on the insulating substrate. Some of the plurality of thin film transistors may be connected to a plurality of pixel electrodes 121.

The lower substrate 110 may include pixel areas PA and a light blocking area BA surrounding the pixel area PA. The light emitting diode 120 may be disposed on the lower substrate 110. The light emitting diode 120 may provide a light to the color conversion substrate 200. The light emitting diode 120 may include the plurality of pixel electrodes 121, a plurality of light emitting layers 122, 123, 124, and a common electrode 125. The plurality of pixel electrodes 121 may be disposed to be spaced apart from each other. In embodiments, each of the plurality of pixel electrodes 121 may be disposed in each of the pixel areas PA. In addition, in embodiments, the plurality of pixel electrodes 121 may be cathode electrodes. The plurality of pixel electrodes 121 may include a transparent conductive material such as indium-tin oxide ("ITO"), indium-zinc oxide ("IZO"), zinc oxide (ZnO), and indium oxide (In2O3). Alternatively, the plurality of pixel electrodes 121 may further include silver (Ag), magnesium (Mg), aluminum (Al), platinum (Pt), lead (Pd), gold (Au), nickel (Ni), neodium (Nd), Iridium (Ir), chromium (Cr), lithium (Li), calcium (Ca), or a mixture thereof.

The pixel defining layer 126 may be disposed on the lower substrate 110. The pixel defining layer 126 may be disposed to cover a portion of the plurality of pixel electrodes 121. That is, the pixel defining layer 126 may define an opening portion exposing the portion of the plurality of pixel electrodes 121. The pixel defining layer 126 may include an organic material or an inorganic material. For example, the pixel defining layer 126 may include a photoresist, a polyimide resin, an acrylic resin, a silicone compound, a polyacrylic resin, or the like.

Each of the plurality of light emitting layers 122, 123, 124 may be disposed on each of the plurality of pixel electrodes 121. Each of the plurality of light emitting layers 122, 123, 124 may be disposed in the opening portion. The plurality of light emitting layers 122, 123, 124 may include a red light emitting layer 122, a green light emitting layer 123, and a blue light emitting layer 124. However, this is exemplary, and the plurality of light emitting layers 122, 123, 124 may be light emitting layers emitting different colors from each other. In another embodiment, the plurality of light emitting layers 122, 123, 124 may be light emitting layers emitting the same color.

The common electrode 125 may be disposed on the plurality of light emitting layers 122, 123, 124 and the pixel defining layer 126. The common electrode 125 may be disposed without distinction between the pixel areas PA and the light blocking area BA. That is, common electrode 125 may cover both the pixel areas PA and the light blocking area BA. The common electrode 125 may include substantially the same material as the plurality of pixel electrodes 121.

The light emitting diode 120 may be an organic light emitting diode. Even though, the display device 10 in the drawing is illustrated as an organic light-emitting display device, but the invention is not limited thereto, and may be various display devices such as a liquid crystal display device and a plasma display device.

The encapsulation layer 130 may be disposed on the common electrode 125. The encapsulation layer 130 may include a first inorganic layer 131, an organic layer 132, and a second inorganic layer 133. However, this is exemplary, and the encapsulation layer 130 may be a single layer or a multilayer including four or more films. The first inorganic layer 131 and the second inorganic layer 133 may include at least one of silicon oxide (SiOx), silicon nitride (SiNx), and silicon oxynitride (SiONx). The organic layer 132 may include at least one of epoxy, acrylate, and urethane acrylate.

Hereinafter, the color conversion substrate 200 will be described.

Referring more to FIGS. 2, 3 and 4, the color conversion substrate 200 according to an embodiment may include a upper substrate 210, a plurality of color filter layers 220, a low refractive index layer 230, a protective layer 231, a color conversion unit 240, a bank 300, a light blocking layer 270, and a spacer 250.

The color conversion substrate 200 may be disposed on the array substrate 100. The array substrate 100 and the color conversion substrate 200 may be combined.

The upper substrate 210 may face the lower substrate 110. Since the lower substrate 110 includes the pixel areas PA and the light blocking area BA, the upper substrate 210 may also be divided into the pixel areas PA and the light blocking area BA. The upper substrate 210 may be a transparent substrate, and first to third color lights emitted from a first color conversion layer 241, a second color conversion layer 242, and a transmission layer 243, respectively, may be emitted through the pixel area PA of the upper substrate 210.

The upper substrate 210 may include an insulating material such as glass, plastic, crystal, or the like. However, a material of the upper substrate 210 is not particularly limited as long as the material is commonly used. The upper substrate 210 may include, for example, an organic polymer material such as polycarbonate ("PC"), polyethylene terephthalate ("PET"), polyethylene ("PE"), polypropylene ("PP") or the like.

The light blocking layer 270 may be disposed on a lower surface of the upper substrate 210. The light blocking layer 270 may be disposed to overlap the light blocking area BA in a plan view. The light blocking layer 270 may have a thin film shape in a cross-sectional view. The light blocking layer 270 may prevent a light leakage to the outside through the light blocking area BA.

The plurality of color filter layers 220 may be disposed on a lower surface of the upper substrate 210. The plurality of color filter layers 220 may include a red color filter layer 221, a green color filter layer 222, and a blue color filter layer 223. The red color filter layer 221 may selectively transmit a red light. The green color filter layer 222 may selectively transmit a green light. The blue color filter layer 223 may selectively transmit a blue light.

The bank 300 may be disposed on a lower surface of the plurality of color filter layers 220. The bank 300 may be disposed in the light blocking area BA on the lower surface of the upper substrate 210. The bank 300 may block that a first color light emitted from the first color conversion layer 241 is irradiated to the second color conversion layer 242 or the transmission layer 243. The bank 300 may block that a second color light emitted from the second color conversion layer 242 is irradiated to the first color conversion layer 241 or the transmission layer 243. The bank 300 may block that a third color light emitted from the transmission layer 243 is irradiated to the first color conversion layer 241 or the second color conversion layer 242. In an embodiment, the first color may be red, the second color may be green, and the third color may be blue. However, embodiments of the present invention are not limited thereto, and the first to third colors may mean different colors in another embodiment.

The bank 300 may define first opening areas 411, 412, 413. Each of the first color conversion layer 241, the second color conversion layer 242, and the transmission layer 243 may be formed in the first opening areas 411, 412, 413, respectively, by an inkjet method.

The spacer 250 may be disposed on the lower surface of the bank 300. The spacer 250 may serve to maintain a gap between the color conversion substrate 200 and the array substrate 100. In addition, the spacer 250 may serve to make the gap constant. In an embodiment, the spacer 250 may be disposed to be spaced apart from the second opening area 423 adjacent to the transmission layer 243 in the second direction D2. However, embodiments of the present invention are not limited thereto, and the spacer 250 may be disposed to be spaced apart from one of the second opening area 421 adjacent to the first color conversion layer 241 or the second opening area 422 adjacent to the second color conversion layer 242. At least one spacer 250 may be formed per unit area (area A), and may not be formed in some unit areas.

The color conversion unit 240 may be disposed on the lower surface of the plurality of color filter layers 220. The color conversion unit 240 may include a first color conversion layer 241, a second color conversion layer 242, and a transmission layer 243. The first color conversion layer 241, the second color conversion layer 242, and the transmission layer 243 may be disposed in the pixel areas PA on the lower surface of the upper substrate 210, respectively. The first color conversion layer 241 may convert a light generated from the light emitting diode 120 into a first color light. The second color conversion layer 242 may convert the light into a second color light. The transmission layer 243 may transmit the light. In an embodiment, the light may be blue light. However, embodiments of the present invention are not limited thereto, and the light may mean a light of another color such as white light.

The first color conversion layer 241 may include a first color conversion particle that is excited by light generated from the light emitting diode 120 and emits a first color light. The first color conversion layer 241 may further include a first photosensitive polymer in which first scattering particles are dispersed.

The second color conversion layer 242 may include a second color conversion particle that is excited by the light generated from the light emitting diode 120 and emits a second color light. The second color conversion layer 242 may further include a second photosensitive polymer in which second scattering particles are dispersed. Each of the first color conversion particles and the second color conversion particles may mean a quantum dot.

The transmission layer 243 may transmit the light generated from the light emitting diode 120 and emit the light toward the upper substrate 210. The transmission layer 243 may include a third photosensitive polymer in which third scattering particles are dispersed. Each of the first to third photosensitive polymers may be an organic material having a light transmittance, such as a silicone resin or an epoxy resin. The first to third photosensitive polymers may be the same material. The first to third scattering particles may scatter and emit a light generated from the light emitting diode 120, and the first to third scattering particles may be the same material.

The red color filter layer 221 and the first color conversion layer 241 may be disposed on the red light emitting layer 122. The green color filter layer 222 and the second color conversion layer 242 may be disposed on the green light emitting layer 123. The blue color filter layer 223 and the transmission layer 243 may be disposed on the blue light emitting layer 124.

The low refractive index layer 230 may be disposed between the plurality of color filter layers 220 and the color conversion unit 240. The low refractive index layer 230 may be disposed over the pixel areas PA and the light blocking area BA. The low refractive index layer 230 may have a refractive index lower than that of the color conversion unit 240. The low refractive index layer 230 may include at least one of zinc oxide (ZnO) particles, titanium dioxide (TiO2) particles, hollow silica particles that are empty, silica particles that are not empty, nano silicate particles, and porogens.

The protective layer 231 may be disposed on the lower surface of the low refractive index layer 230. The protective layer 231 may be disposed on the entire surface of the low refractive index layer 230. The protective layer 231 may prevent impurities such as moisture or air from penetrating from the outside to damage or contaminate the light blocking layer 270 and the plurality of color filter layers 220. In an embodiment, the protective layer 231 may be made of an inorganic material. In an embodiment, for example, the protective layer 231 may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, or the like.

The filling layer 260 may be disposed between the color conversion substrate 200 and the array substrate 100. The filling layer 260 may include a transmissive transparent material. The filling layer 260 may be disposed to maintain a filling gap between the color conversion substrate 200 and the array substrate 100. The filling layer 260 may be disposed between the color conversion substrate 200 and the array substrate 100 when manufacturing and combining the color conversion substrate 200 and the array substrate 100, respectively. The filling layer 260 may be made of an organic material. For example, the filling layer 260 may be made of a Si-based organic material, an epoxy-based organic material, or the like, but is not limited thereto. In another embodiment, the filling layer 260 may be omitted.

Referring FIGS. 3 and 4, the color conversion substrate 200 according to an embodiment may define a first opening area 411 and a second opening area 421. Specifically, the bank 300 may define first opening areas 411, 412, 413 and second opening areas 421, 422, 423. In the embodiments of the present invention, each of the first opening area and the second opening area adjacent to the first opening area may be repeatedly disposed in a first direction D1, and the first opening area and the second opening area may be alternately disposed in a second direction D2 perpendicular to the first direction D1. The first direction D1 and the second direction D2 defines a major surface plane of the color conversion substrate 200.

Specifically, the bank 300 may define a first opening area 411 in which the first color conversion layer 241 is disposed and a second opening area 421 adjacent to the first color conversion layer 241 in the second direction D2. The bank 300 may define a first opening area 412 in which the second color conversion layer 242 is disposed and a second opening area 422 adjacent to the second color conversion layer 242 in the second direction D2. The bank 300 may define a first opening area 413 in which the transmission layer 243 is disposed and a second opening area 423 adjacent to the transmission layer 243 in the second direction D2. In addition, the bank 300 may further include the spacer 250 disposed to be spaced apart from the second opening area 423 in the second direction D2.

The second opening area 423 adjacent to the transmission layer 243 may have a size (e.g., area) smaller than the size of each of the second opening area 421 adjacent to the first color conversion layer 241 and the second opening area 422 adjacent to the second color conversion layer 242. Hereinafter, the first opening area 411 in which the first color conversion layer 241 is disposed, the second opening area 421 disposed adjacent to the first color conversion layer 241, and the spacer 250 will be described. The second opening areas 422, 423 adjacent to the second color conversion layer 242 and the transmission layer 243, respectively, may also have the same configuration as the second opening area 421 adjacent to the first color conversion layer 241, and in addition, a description of the overlapped part may be omitted.

The first color conversion layer 241 may be disposed in the first opening area 411. The second opening area 421 may be adjacent to a first surface 411a of the first opening area 411. The second opening area 421 may include at least one partition wall 700. At least one partition wall 700 may be disposed in the second opening area 421, and may divide the second opening area 421 into a plurality of sub-opening areas 421x, 421y, 421z. The plurality of sub-opening areas 421x, 421y, 421z may have a total volume smaller than that of the first opening area 411. At least one partition wall 700 may include the same material as the bank 300. That is, at least one partition wall 700 may be defined as a portion of the bank 300, which remains in the second opening area 421 after the bank 300 is patterned. That is, the second opening area may include a plurality of sub-opening areas and at least one partition wall between the plurality of sub-opening areas. A boundary of the second opening area may be defined by the boundary of plurality of sub-opening areas and at least one partition wall.

At least one partition wall 700 may divide the second opening area 421 into the plurality of sub-opening areas 421x, 421y, 421z. When the color conversion substrate 200 is manufactured, the bank 300 disposed between the first opening area 411 and the second opening area 421 may be lost. When the bank 300 is lost, an ink provided in the first opening area 411 may leak into the second opening area 421. Even at this case, since each of the sub-opening areas 421x, 421y, 421z in an embodiment has a volume smaller than that of the first opening area 411, the amount of ink leaking into the second opening area 412 may be smaller than the case that there is no partition wall 700 in the second opening area 412. Accordingly, a dark spot generated in the display device 10 may be effectively prevented.

In addition, when the height of a misplaced ink on the bank 300 is higher than the height of the spacer 250 during the inkjet process, the color conversion substrate 200 or the array substrate 100 may be easily broken. Accordingly, in an embodiment, the second opening area 421 capable of accommodating the misplaced ink may be disposed adjacent to the first opening area 411.

At least one partition wall 700 may have a shape of one of a straight, curved, and bent shape. The shape of the partition wall 700 according to the invention is not limited thereto, and may be various shapes capable of dividing the second opening area 421 into the plurality of sub-opening areas 421x, 421y, 421z.

The at least one partition wall 700 may have a width h2 in the second direction D2 smaller than the width h1 of the spacer 250. When an ink forming the first color conversion layer 241 is erroneously deposited on the partition wall 700, if the size of the ink is larger than the width h2 of the partition wall 700, the ink may flow into the first opening area 411 or the second opening area 421. When the partition wall 700 has the width h2 in the second direction D2 smaller than the width h1 of the spacer 250, an amount of the ink misplaced on the bank 300 flowing into the plurality of sub-opening areas 421x, 421y, 421z may increase, so that a size of a protrusion formed by the misplaced ink on the partition wall 700 may decrease.

In an embodiment, a first partition wall 500 and a second partition wall 600 may be disposed in the second opening area 421. That is, at least one partition wall 700 may include the first partition wall 500 and the second partition wall 600. However, embodiments of the present invention are not limited thereto, for example, the at least one partition wall 700 may mean only one partition wall, and only one partition wall may be disposed in the second opening area 421. In addition, the at least one partition wall 700 may mean three or more partition walls, and the three or more partition walls may be disposed in the second opening area 421.

Referring to FIG. 3, the first partition wall 500 and the second partition wall 600 may have a straight shape. The first partition wall 500 and the second partition wall 600 may extend in the first direction D1. The first partition wall 500 and the second partition wall 600 may be spaced apart in the second direction D2 perpendicular to the first direction D1. The first partition wall 500 and the second partition wall 600 may divide the second opening area 421 into the plurality of sub-opening areas 421x, 421y, 421z. Specifically, the second opening area 421 may be divided into the first sub-opening area 421x, the second sub-opening area 421y, and the third sub-opening area 421z. The plurality of sub-opening areas 421x, 421y, 421z may have a total volume smaller than that of the first opening area 411.

Since the first partition wall 500 and the second partition wall 600 extend in the first direction D1, the plurality of sub-opening areas 421x, 421y, 421z may have a rectangular shape that is longer in the first direction D1 than in the second direction D2. In some embodiment, the plurality of sub-opening areas 421x, 421y, 421z may not be divided into the same volume. That is, all of the plurality of sub-opening areas 421x, 421y, 421z may have different volumes.

In addition, although not shown in the drawings, the first partition wall 500 and the second partition wall 600 may be disposed to be inclined with respect to the first direction D1. Accordingly, the plurality of sub-opening areas 421x, 421y, 421z may have square shapes such as trapezoid and parallelogram shapes rather than rectangular shapes in a plan view.

Referring to FIG. 4, when the ink is provided to the first opening area 411, the ink may be the most likely to be misplaced in the first sub-opening area 421x closest to the first opening area 411 among the plurality of sub-opening areas 421x, 421y, 421z. The first sub-opening area 421x may mean an opening disposed between the bank 300 disposed between the first opening area 411 and the second opening area 421 and the first partition wall 500. Accordingly, the misplaced ink may be accommodated in the first sub-opening area 421x and may not leak to other members. Therefore, a contamination due to the ink may be effectively prevented.

The second sub-opening area 421y may mean an opening disposed between the first partition wall 500 and the second partition wall 600, and the third sub-opening area 421z may mean an opening disposed between the second partition wall 600 and the bank 300 disposed on a second surface 421b of the second opening area 421. Like the first sub-opening area 421x, the second sub-opening area 421y and the third sub-opening area 421z may prevent the ink from leaking to the other members by accommodating the misplaced ink.

The bank 300 may be lost during a process of manufacturing the color conversion substrate 200. When the bank 300 is lost, the ink provided in the first opening area 411 may be leaked to the second opening area 421. In this case, when the ink is excessively leaked, dark spots may be generated in the display device including the color conversion substrate 200. In order to keep an amount of the ink leaked out less, the second opening area 421 may be divided into the plurality of sub-opening areas 421x, 421y, 421z having a total volume smaller than that of the first opening area 411. Accordingly, even if the ink flows out to the first sub-opening area 421x among the second opening area 421, a thickness h4 of the ink forming the first color conversion layer 241 may be maintained at a certain thickness or more. The certain thickness may mean a thickness h4 of the first color conversion layer 241 capable of preventing dark spots from occurring in the display device 10. Accordingly, occurring the dark spots in the display device due to the plurality of sub-opening areas 421x, 421y, 421z of the second opening area 421 may be effectively prevented. In addition, in order to prevent occurring the dark spots in the plan view, the first sub-opening area 421x in which the ink is most leaked may have a volume smaller than each of the volumes of the second sub-opening area 421y and the third sub-opening area 421z.

According to an embodiment, a width d of the bank 300 disposed between the first and second opening areas 411 and 421 may be smaller than the width h1 of the spacer 250. Specifically, the width d of the bank 300 may be about 10 micrometers or more to about 25 micrometers or less. The width h1 of the spacer 250 may be about 30 micrometers or more to about 45 micrometers or less. When the width d of the bank 300 disposed between the first opening area 411 and the second opening area 421 is excessively large, during combining the color conversion substrate 200 and the array substrate 100, a defect may occur due to a protrusion formed by the ink misplaced on the bank 300. When the width d of the bank 300 in the second direction D2 is smaller than the width h1 of the spacer 250, a size of the protrusion formed from the misplaced ink on the bank 300 may be decreased by increasing an amount of the ink which is misplaced on the bank 300 flowing into the plurality of sub-opening areas 421x, 421y, 421z.

Figure 5:
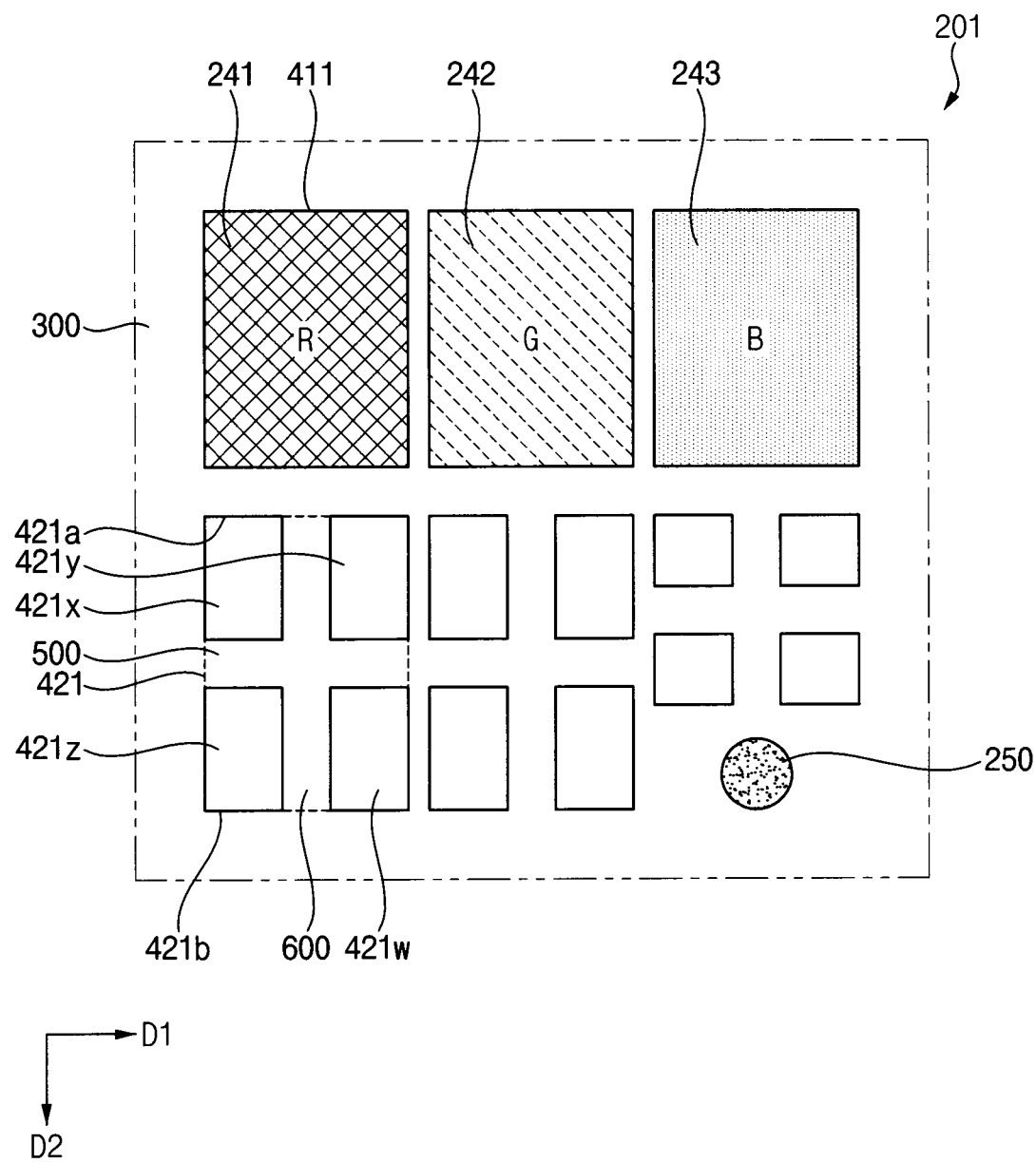
FIG. 5 is a plan view illustrating a color conversion substrate according to an embodiment of the present invention.

FIG. 5 is a plan view illustrating a color conversion substrate according to an embodiment of the present invention.

Referring to FIG. 5, a color conversion substrate 201 according to an embodiment may include a bank 300, and the bank 300 may include a first partition wall 500 and a second partition wall 600. The first partition wall 500 and the second partition wall 600 may have a straight shape. The first partition wall 500 and the second partition wall 600 may cross each other. The first partition wall 500 may extend in the first direction D1. The second partition wall 600 may extend in the second direction D2 perpendicular to the first direction D1. The first partition wall 500 and the second partition wall 600 may divide the second opening area 421 into a plurality of sub-opening areas 421x, 421y, 421z, 421w. Specifically, the second opening area 421 may be divided into a first sub-opening area 421x, a second sub-opening area 421y, a third sub-opening area 421z, and a fourth sub-opening area 421w.

Since the first partition wall 500 extends in the first direction D1 and the second partition wall 600 extends in the second direction D2, the plurality of sub-opening areas 421x, 421y, 421z, 421w may have rectangular shapes in a plan view. In this case, the plurality of sub-opening areas 421x, 421y, 421z, 421w may not be divided into the same volume. That is, all of the plurality of sub-opening areas 421x, 421y, 421z, 421w may have different volumes from each other.

In addition, although not shown in the drawings, the first partition wall 500 may be disposed to be inclined with respect to the first direction D1. In addition, the second partition wall 600 may also be disposed to be inclined with respect to the second direction D2. Accordingly, the plurality of sub-opening areas 421x, 421y, 421z, 421w may have square shapes such as trapezoid shapes rather than rectangular shapes in a plan view.

As described above, the dark spots may occur in the display device 10 due to a large amount of the ink forming the color conversion unit 240 leaking. To prevent this, the first partition wall 500 may be disposed closer to the first surface 421a than the second surface 421b of the second opening area 421. The first surface 421a of the second opening area 421 may be a surface adjacent to the first opening area 411. The second surface 421b of the second opening area 421 may be a surface facing the first surface 421a. Accordingly, the volume of each of the first sub-opening area 421x and the second sub-opening area 421y may be smaller than the volumes of each of the third sub-opening area 421z and the fourth sub-opening area 421w.

Figure 6:
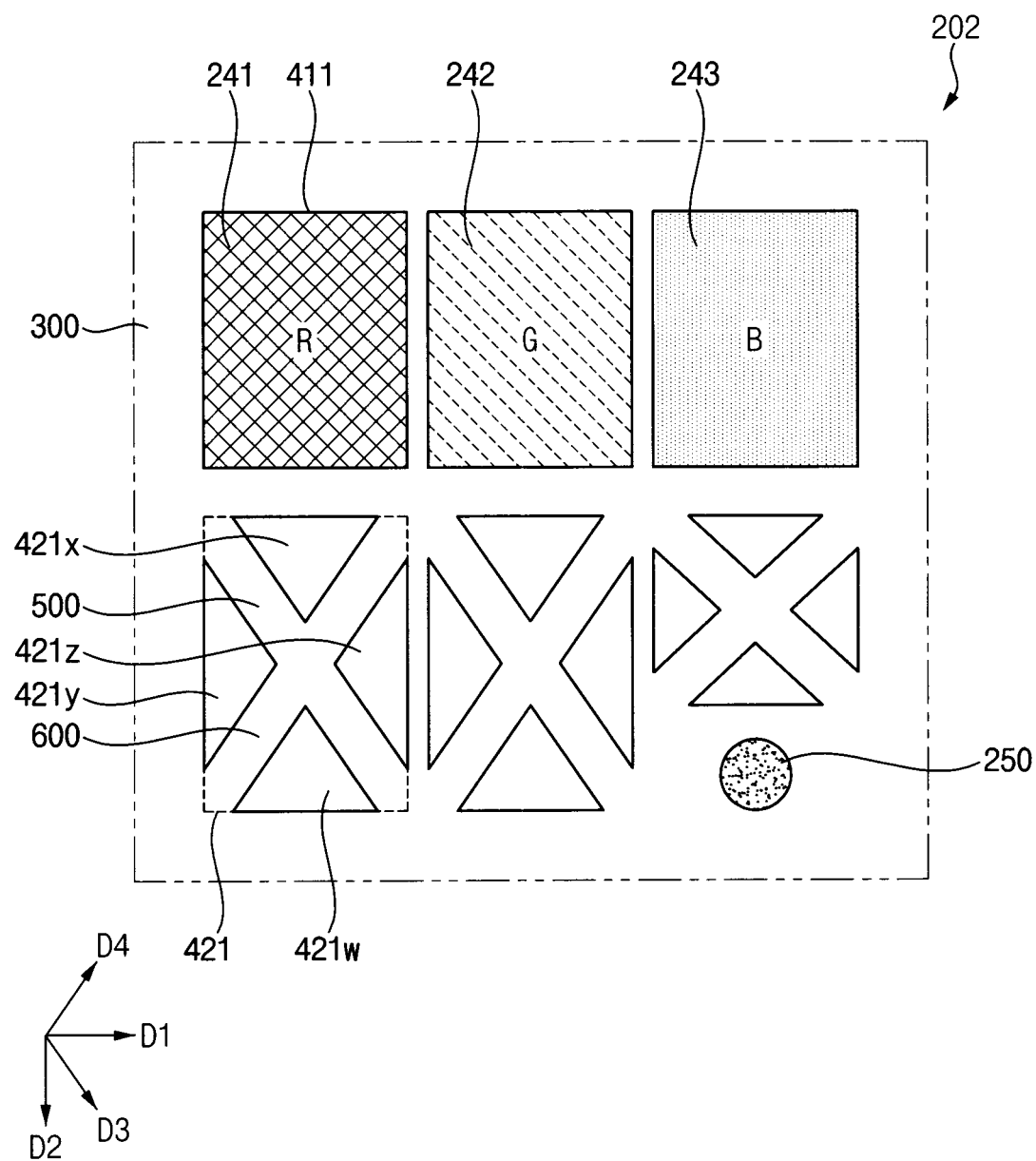
FIG. 6 is a plan view illustrating a color conversion substrate according to another embodiment of the present invention.

FIG. 6 is a plan view illustrating a color conversion substrate according to another embodiment of the present invention.

Referring to FIG. 6, a color conversion substrate 202 according to an embodiment may include a bank 300, and the bank 300 may include a first partition wall 500 and a second partition wall 600. The first partition wall 500 and the second partition wall 600 may have a straight shape. The first partition wall 500 and the second partition wall 600 may cross each other. The first partition wall 500 may extend in a first diagonal direction D3. The second partition wall 600 may extend in a second diagonal direction D4 different from the first diagonal direction D3. The first direction D1, the second direction D2, the first diagonal direction D3 and the second diagonal direction D4 cross each other. The first partition wall 500 and the second partition wall 600 may divide the second opening area 421 into a plurality of sub-opening areas 421x, 421y, 421z, 421w. Specifically, the second opening area 421 may be divided into a first sub-opening area 421x, a second sub-opening area 421y, a third sub-opening area 421z, and a fourth sub-opening area 421w.

Since the first partition wall 500 is disposed in the first diagonal direction D3 and the second partition wall 600 is disposed in the second diagonal direction D4, the plurality of sub-opening areas 421x, 421y, 421z, 421w may have a triangular shape in a plan view. In this case, the plurality of sub-opening areas 421x, 421y, 421z, and 421w may not be divided into the same volume. That is, all of the plurality of sub-opening areas 421x, 421y, 421z, 421w may have different volumes from each other.

Further, even in FIG. 6, opposite distal ends of the first partition wall 500 and opposite distal ends of the second partition wall 600 are drawn to be disposed at corners of the second opening area 421, respectively, but the opposite distal ends of the first partition wall 500 and the opposite distal ends of the second partition wall 600 may not be disposed at the corners in another embodiment. That is, the opposite distal ends of the first partition wall 500 and the opposite distal ends of the second partition wall 600 may be disposed at one of the corners and four surfaces of the second opening area 421, respectively. In this case, the plurality of sub-opening areas 421x, 421y, 421z, 421w may have polygonal shapes rather than triangular shapes in a plan view.

In order to prevent dark spots from occurring in the display device 10 described above, the first sub-opening area 421x may have a volume smaller than the volume of each of the second to fourth sub-opening areas 421y, 421z, 421w.

Figure 7:
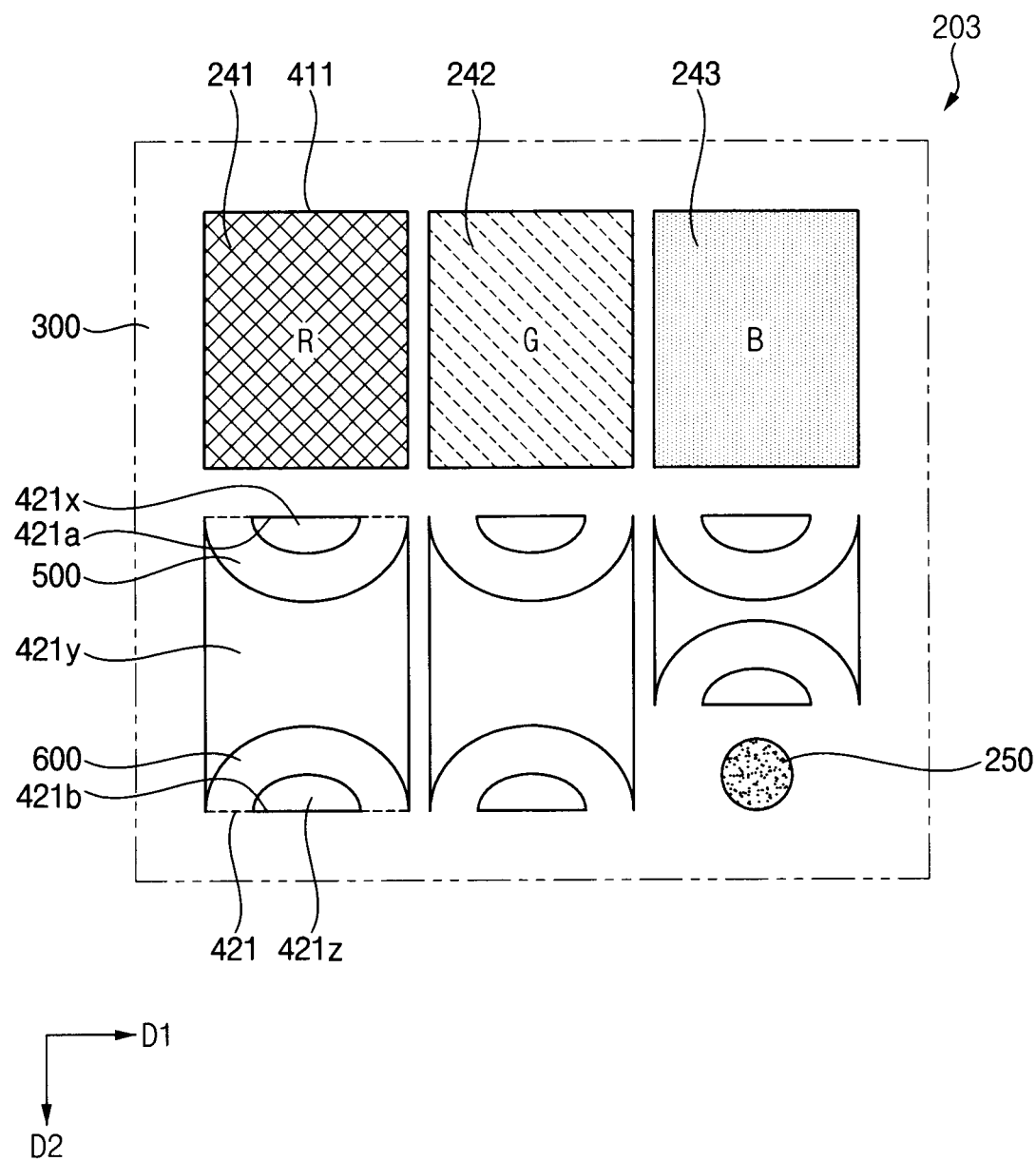
FIG. 7 is a plan view illustrating a color conversion substrate according to still another embodiment of the present invention.

FIG. 7 is a plan view illustrating a color conversion substrate according to still another embodiment of the present invention.

Referring to FIG. 7, a color conversion substrate 203 according to an embodiment may include a bank 300, and the bank 300 may include a first partition wall 500 and a second partition wall 600. The first partition wall 500 and the second partition wall 600 may have curved shapes. The first partition wall 500 may be adjacent to the first surface 421a of the second opening area 421. The second partition wall 600 may be adjacent to the second surface 421b of the second opening area 421. Specifically, opposite distal ends of the first partition wall 500 may be adjacent to the first surface 421a of the second opening area 421, and opposite distal ends of the second partition wall 600 may be adjacent to the second surface 421b of the second opening area 421.

The first partition wall 500 and the second partition wall 600 may divide the second opening area 421 into a plurality of sub-opening areas 421x, 421y, 421z. Specifically, the second opening area 421 may be divided into a first sub-opening area 421x, a second sub-opening area 421y, and a third sub-opening area 421z.

The opposite distal ends of the first partition wall 500 may be adjacent to the first surface 421a of the second opening area 421. Since the opposite distal ends of the second partition wall 600 are adjacent to the second surface 421b of the second opening area 421, some of the plurality of sub-opening areas 421x, 421y, 421z may have a semicircular shape in a plan view. That is, the first sub-opening area 421x and the third sub-opening area 421z may have a semicircular shape in a plan view. The first sub-opening area 421x may have the semicircular shape surrounded by the first partition wall 500 and the bank 300 disposed on the first surface 421a of the second opening area 421. The third sub-opening area 421z may have the semicircular shape surrounded by the second partition wall 600 and the bank 300 disposed on the second surface 421b of the second opening area 421.

Further, although not shown in the drawing, opposite distal ends of the first partition wall 500 may be disposed on other surfaces vertically connected to the first surface 421a of the second opening area 421. The opposite distal ends of the second partition wall 600 may also be disposed on other surfaces vertically connected to the second surface 421b of the second opening area 421.

As described above, in order to prevent dark spots from occurring in the display device, the first sub-opening area 421x may have a volume smaller than the volume of each of the second sub-opening area 421y and the third sub-opening area 421z.

Figure 8:
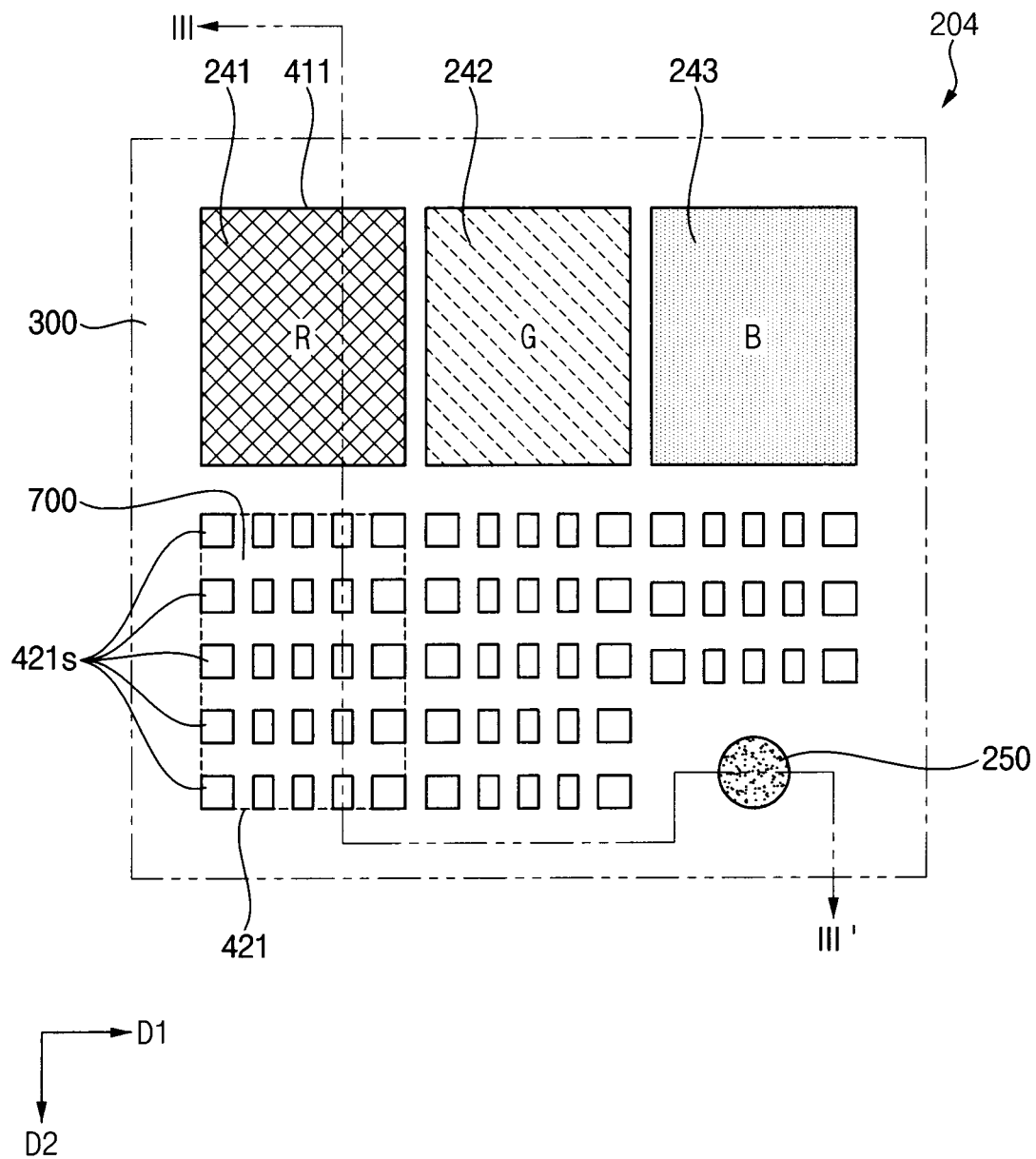
FIG. 8 is a plan view illustrating a color conversion substrate according to further still another embodiment of the present invention.
Figure 9:
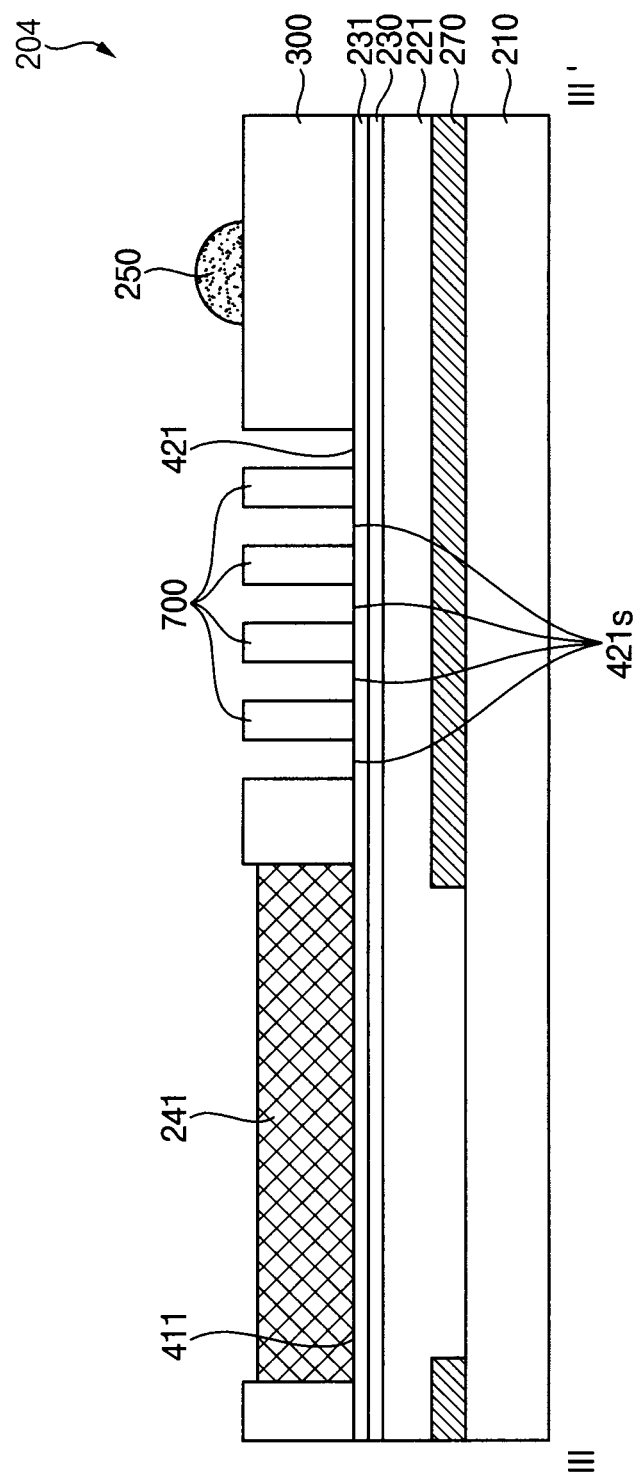
FIG. 9 is a cross-sectional view taken along line of FIG. 8.

FIG. 8 is a plan view illustrating a color conversion substrate according to further still another embodiment of the present invention. FIG. 9 is a cross-sectional view taken along line of FIG. 8.

Referring to FIGS. 8 and 9, a color conversion substrate 204 according to an embodiment may include a bank 300, and the bank 300 may include a plurality of partition walls 700. The plurality of partition walls 700 may have a straight shape. Some of the plurality of partition walls 700 may extend in the second direction D2 and may be arranged in the first direction D1. The remaining part of the plurality of partition walls 700 may extend in the first direction D1 and may be arranged in the second direction D2. That is, the plurality of partition walls 700 may be arranged in a lattice structure.

The plurality of partition walls 700 may divide the second opening area 421 into a plurality of sub-opening areas 421s. Since the plurality of partition walls 700 are arranged in the lattice structure, the plurality of sub-opening areas 421s may have a rectangular shape, respectively. In this case, the plurality of sub-opening areas 421s may not be divided into the same volume. That is, all of the plurality of sub-opening areas 421s may have different volumes from each other.

In addition, although not shown in the drawings, the plurality of partition walls 700 may be disposed to be inclined with respect to the first direction D1 and the second direction D2, respectively. Accordingly, the plurality of sub-opening areas 421s may have square shapes such as trapezoid shapes rather than rectangular shapes.

As described above, in order to prevent dark spots from occurring in the display device, volumes of the plurality of sub-opening areas 421s may be divided into smaller sizes.

Accordingly, only eight partition walls are illustrated in the drawing, but in other embodiments, more partition walls may be disposed in the second opening area 421 than the drawing.

The color conversion substrates 200, 201, 202, 203, 204 shown in FIGS. 3 to 9 are exemplary, and embodiments of the present invention are not limited thereto. In other embodiments, at least one partition wall 700 and a plurality of sub-opening areas illustrated in each of FIGS. 3 to 9 may have various shapes. In addition, the second opening areas 421, 422, 423 may have different shapes, respectively. For example, in an embodiment, the second opening area 421 adjacent to the first color conversion layer 241 may have the shape of the second opening area 421 of FIG. 3, and the second opening area 422 adjacent to the second color conversion layer 242 may have the shape of the second opening area 421 of FIG. 5, and the second opening area 423 adjacent to the transmission layer 243 may have the shape of the second opening area 421 of FIG. 7.

Figure 10:
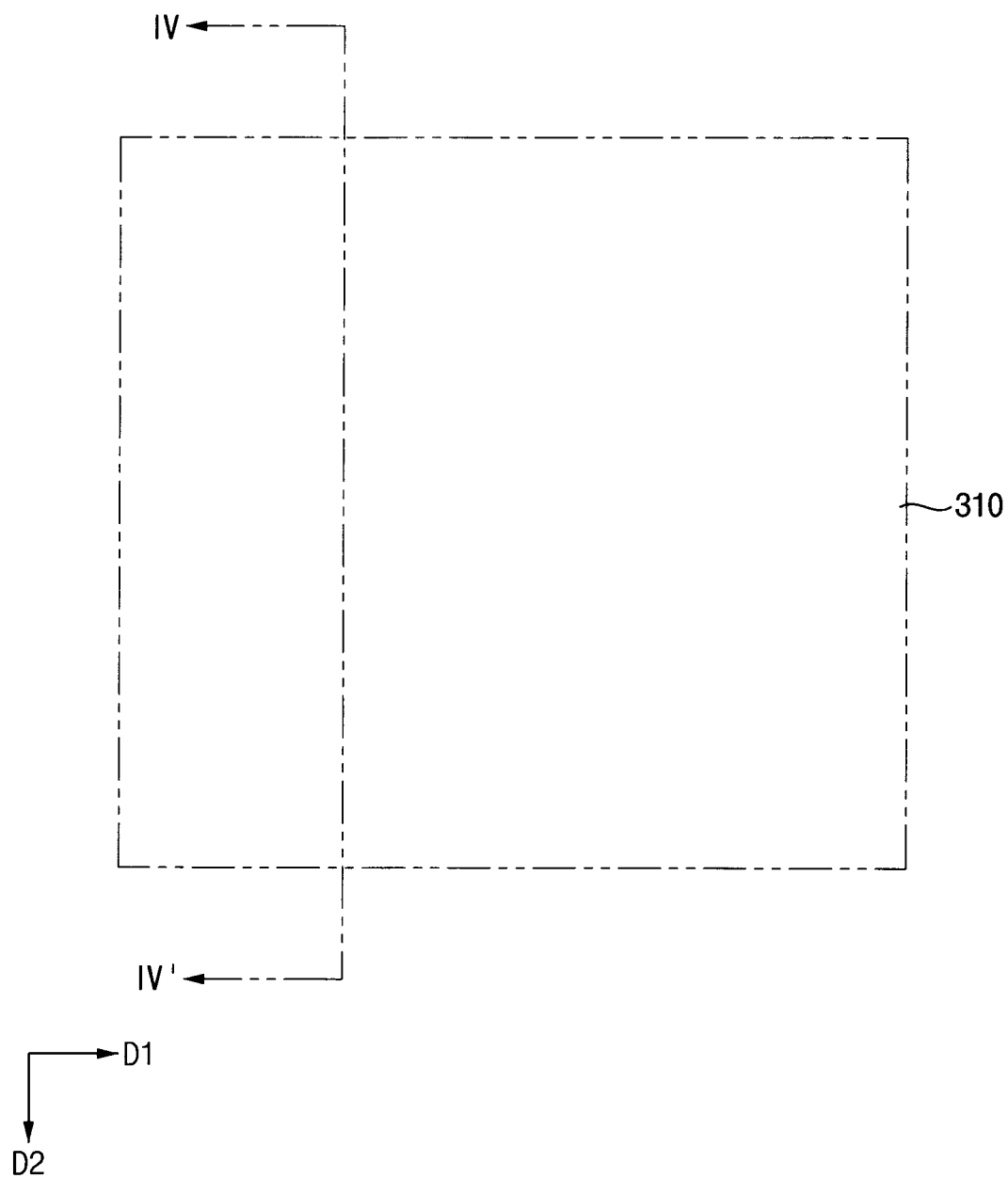
FIG. 10 is a plan view illustrating a method of manufacturing a color conversion substrate according to an embodiment of the present invention.
Figure 11:
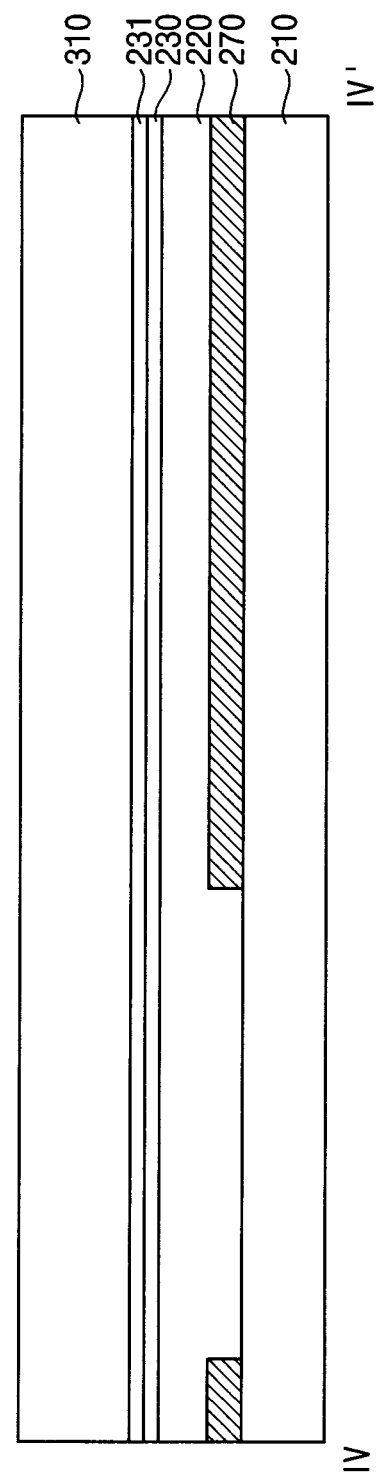
FIG. 11 is a cross-sectional view taken along line IV-IV' of FIG. 10.

FIG. 10 is a plan view illustrating a method of manufacturing a color conversion substrate according to an embodiment of the present invention. FIG. 11 is a cross-sectional view taken along line IV-IV' of FIG. 10.

Referring to FIGS. 10 and 11, an upper substrate 210, a light blocking layer 270, a color filter layer 220, a low refractive index layer 230, a protective layer 231, and a preliminary bank 310 may be provided.

The upper substrate 210 may be formed of an insulating material such as glass, plastic, or crystal. For example, the upper substrate 210 may be formed of an organic polymer material such as polycarbonate (PC), polyethylene terephthalate (PET), polyethylene (PE), polypropylene (PP), or the like. The light blocking layer 270 may be formed in the light blocking area BA of the upper substrate 210. A plurality of color filter layers 220 may be formed on the light blocking layer 270. The low refractive index layer 230 and the protective layer 231 may be formed on the plurality of color filter layers 220. The preliminary bank 310 may be formed on the plurality of color filter layers 220. That is, a material forming the preliminary bank 310 may be applied on the plurality of color filter layers 220.

Figure 12:
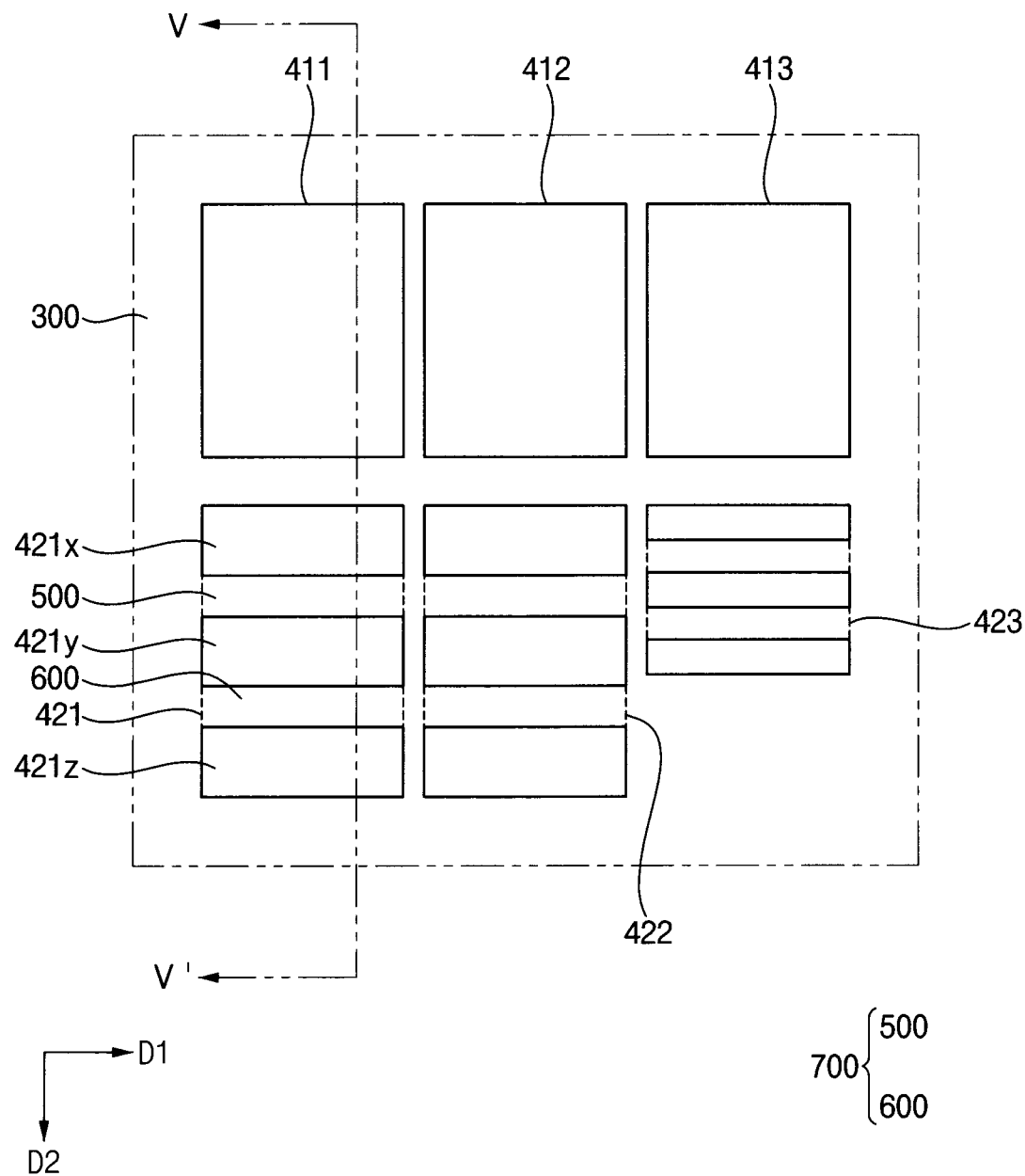
FIG. 12 is a plan view illustrating a method of manufacturing a color conversion substrate according to an embodiment of the present invention.
Figure 13:
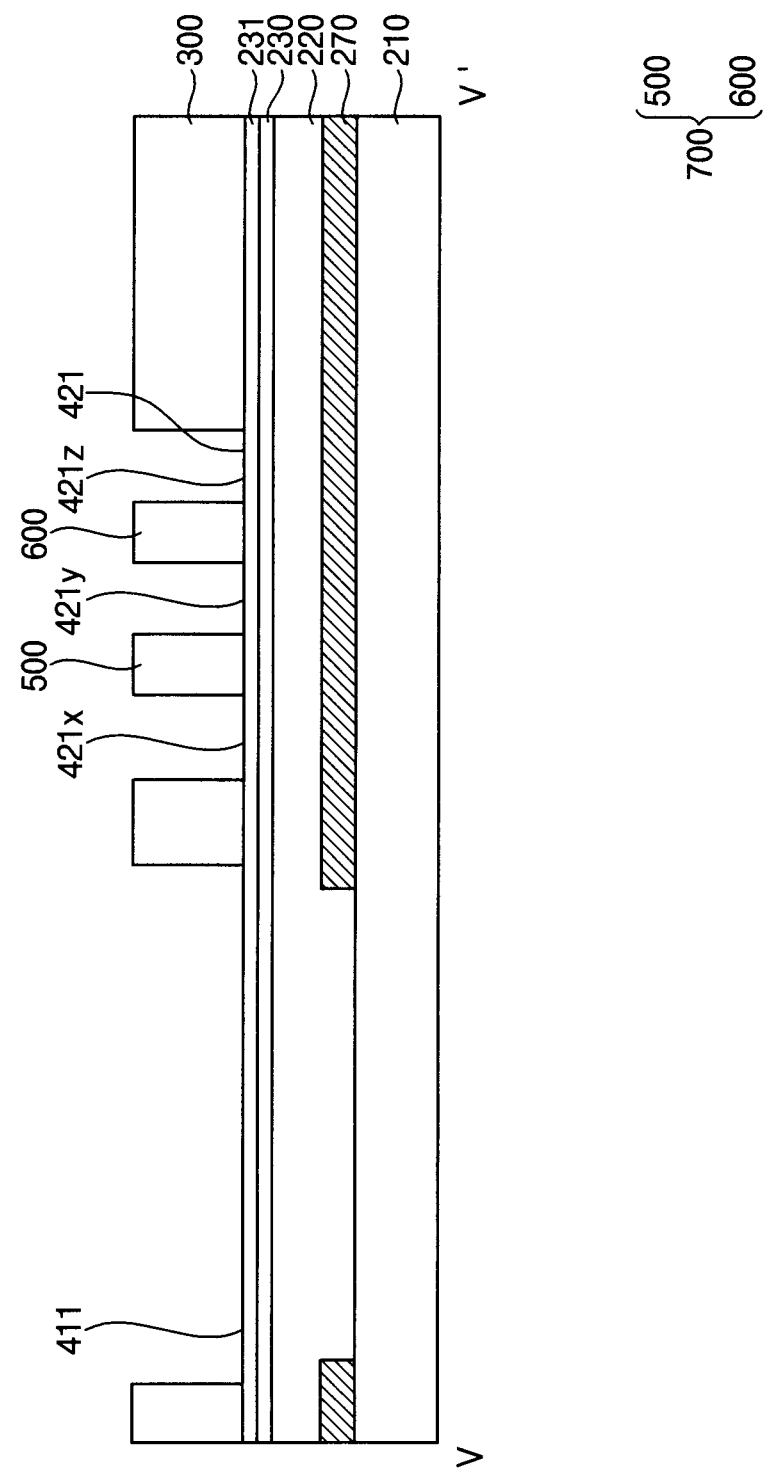
FIG. 13 is a cross-sectional view taken along line of V-V' of FIG. 12.

FIG. 12 is a plan view illustrating a method of manufacturing a color conversion substrate according to an embodiment of the present invention. FIG. 13 is a cross-sectional view taken along line of V-V' of FIG. 12.

Referring to FIGS. 12 and 13, first opening areas 411, 412, 413 and second opening areas 421, 422, 423 may be formed by the applied preliminary bank 310 being partially patterned. The bank 300 may be defined by the first opening areas 411, 412, 413 and the second opening areas 421, 422, 423. In the embodiments of the present invention, the first opening areas 411, 412, 413 and the second opening areas 421, 422, 423 may be repeatedly formed in the first direction D1 or the second direction D2 orthogonal to the first direction D1.

Hereinafter, the first opening area 411 and the second opening area 421 disposed at far left side of the drawing will be described (see FIG. 14). The second opening areas 422, 423 formed to be spaced apart from the second opening area 421 in the first direction D1 may also have the same configuration as the second opening area 421, and a description of the overlapped part may be omitted.

When the preliminary bank 310 is patterned, at least one partition wall 700 may be formed. Specifically, at least one partition wall 700 may divide the second opening area 421 to form a plurality of sub-opening areas 421x, 421y, 421z. The plurality of sub-opening areas 421x, 421y, 421z may have a total volume smaller than that of the first opening area 411. During the process of manufacturing the color conversion substrate 200, the second opening area 421 may be patterned except for a shape of the partition wall 700. The plurality of sub-opening areas 421x, 421y, 421z may be formed through the patterning process.

The at least one partition wall 700 may include a first partition wall 500 and a second partition wall 600. The first partition wall 500 and the second partition wall 600 may have shapes of one of a straight shape, a curved shape, and a bent shape. However, the shapes of the first partition wall 500 and the second partition wall 600 are not limited thereto, and may be a shape capable of dividing the second opening area 421 into the plurality of sub-opening areas 421x, 421y, 421z. In addition, the plurality of sub-opening areas 421x, 421y, 421z are also illustrated in rectangular shapes in FIG. 12, but may have various shapes.

Figure 14:
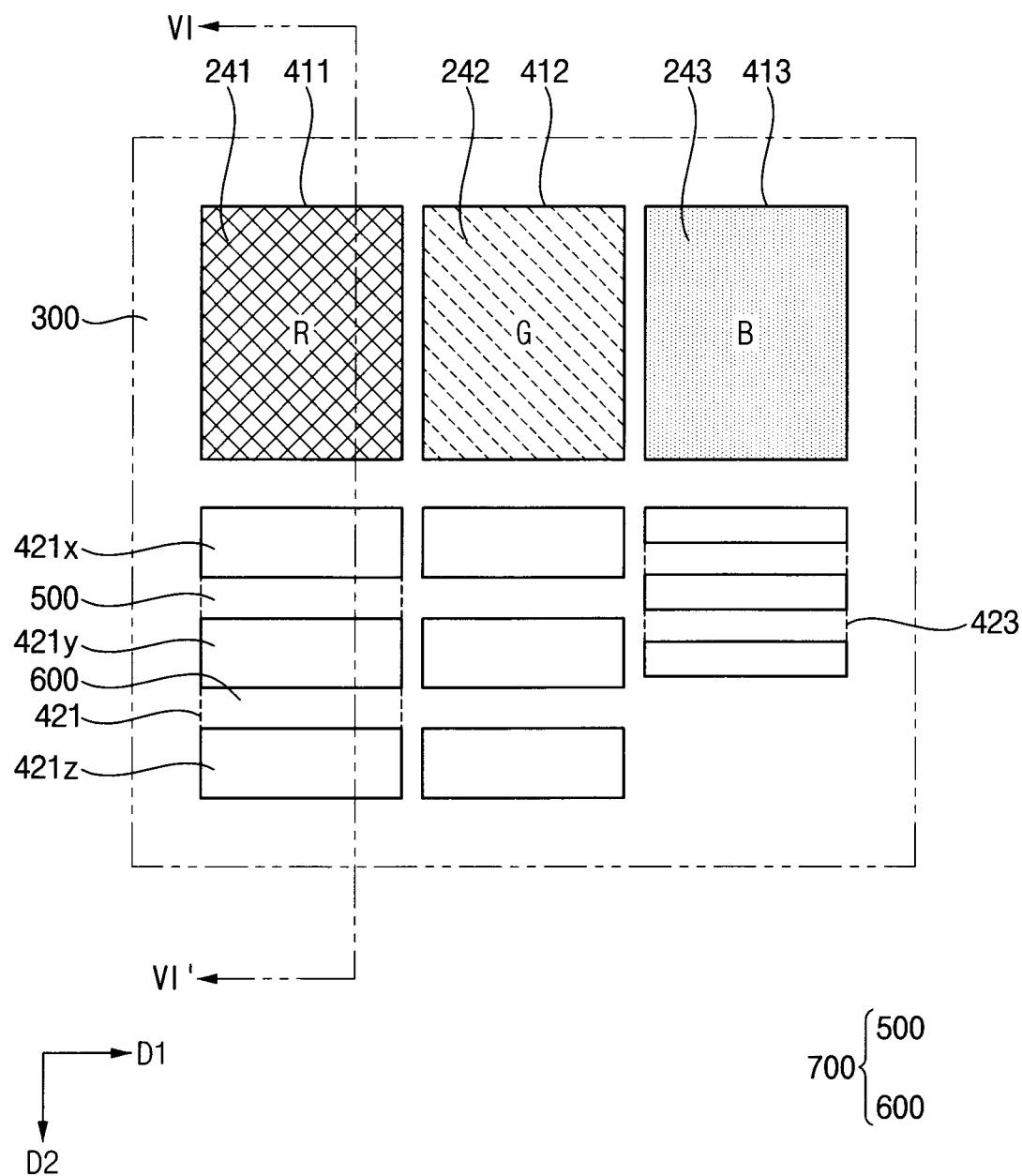
FIG. 14 is a plan view illustrating a method of manufacturing a color conversion substrate according to an embodiment of the present invention.
Figure 15:
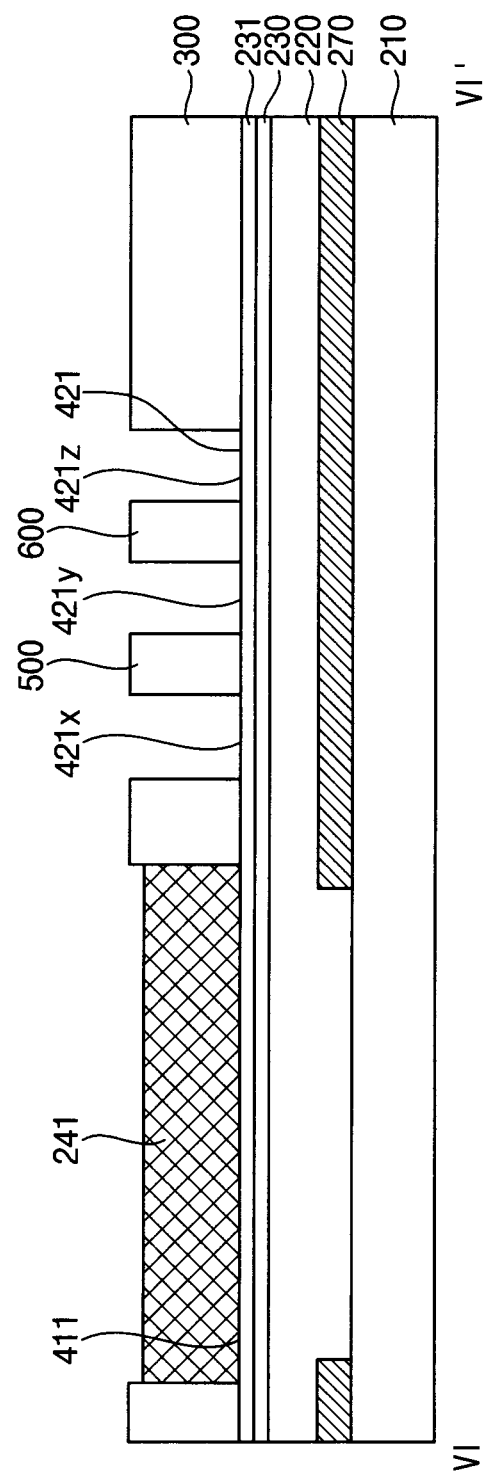
FIG. 15 is a cross-sectional view taken along line VI-VI' of FIG. 14.

FIG. 14 is a plan view illustrating a method of manufacturing a color conversion substrate according to an embodiment of the present invention. FIG. 15 is a cross-sectional view taken along line VI-VI' of FIG. 14.

Referring to FIGS. 14 and 15, the color conversion unit 240 may be formed on the plurality of color filter layers 220. The color conversion unit 240 may include a first color conversion layer 241, a second color conversion layer 242, and a transmission layer 243. The first color conversion layer 241, the second color conversion layer 242, and the transmission layer 243 may be formed in the pixel areas PA on the upper substrate 210, respectively. The first color conversion layer 241, the second color conversion layer 242, and the transmission layer 243 may be formed in the first opening areas 411, 412, 413, respectively, defined in the bank 300.

Specifically, the first color conversion layer 241, the second color conversion layer 242, and the transmission layer 243 may be formed by an inkjet process. An ink may be provided to each of the first opening areas 411, 412, 413. The ink may be a material forming the first color conversion layer 241, the second color conversion layer 242, and the transmission layer 243. The ink forming the first color conversion layer 241 may include first color conversion particles. The ink forming the second color conversion layer 242 may include second color conversion particles. After the ink is provided to each of the first opening areas 411, 412, 413, an ink curing machine (not shown) may cure the ink. The first color conversion layer 241, the second color conversion layer 242, and the transmission layer 243 may be formed by curing the ink.

Figure 16:
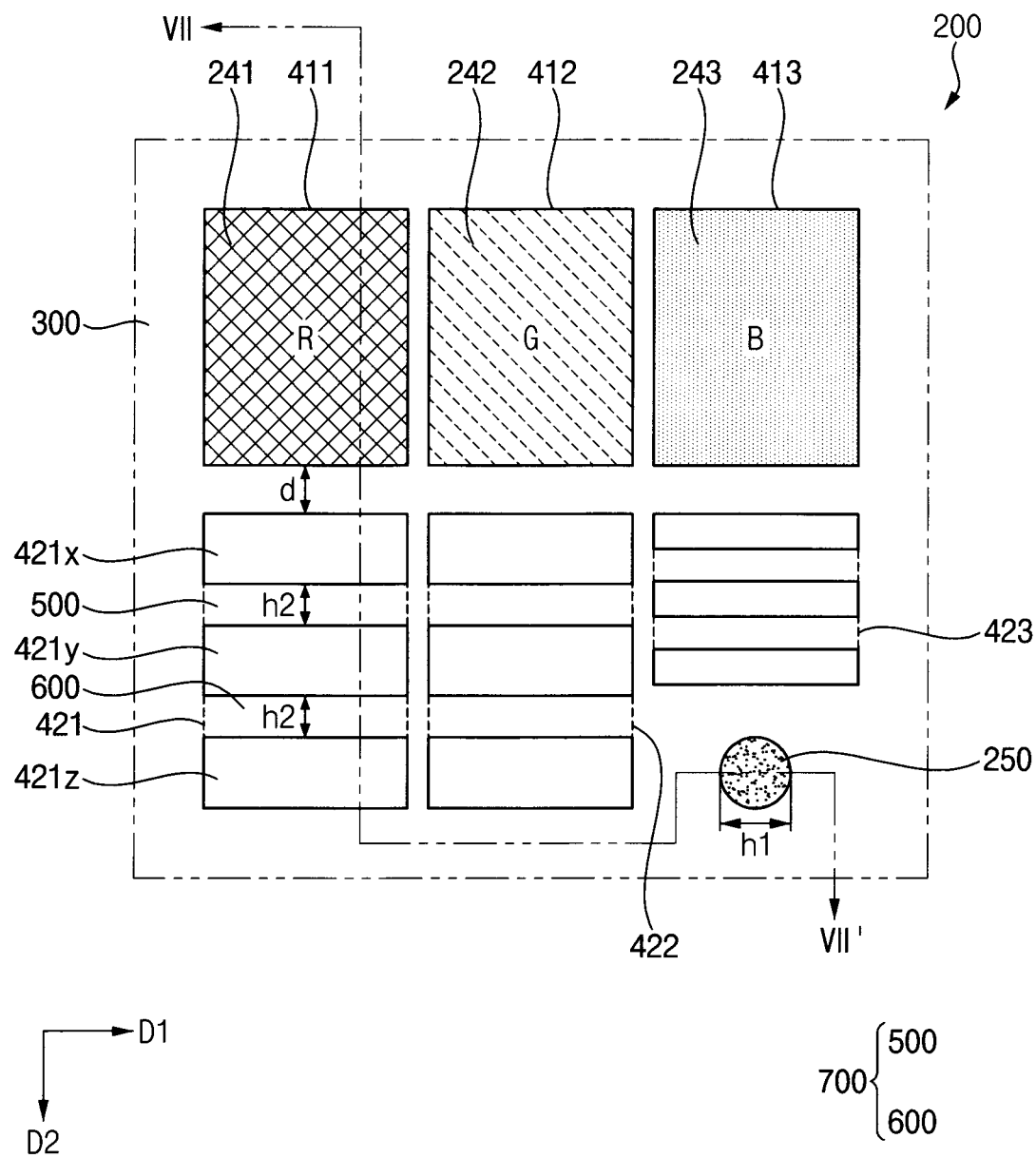
FIG. 16 is a plan view illustrating a method of manufacturing a color conversion substrate according to an embodiment of the present invention.
Figure 17:
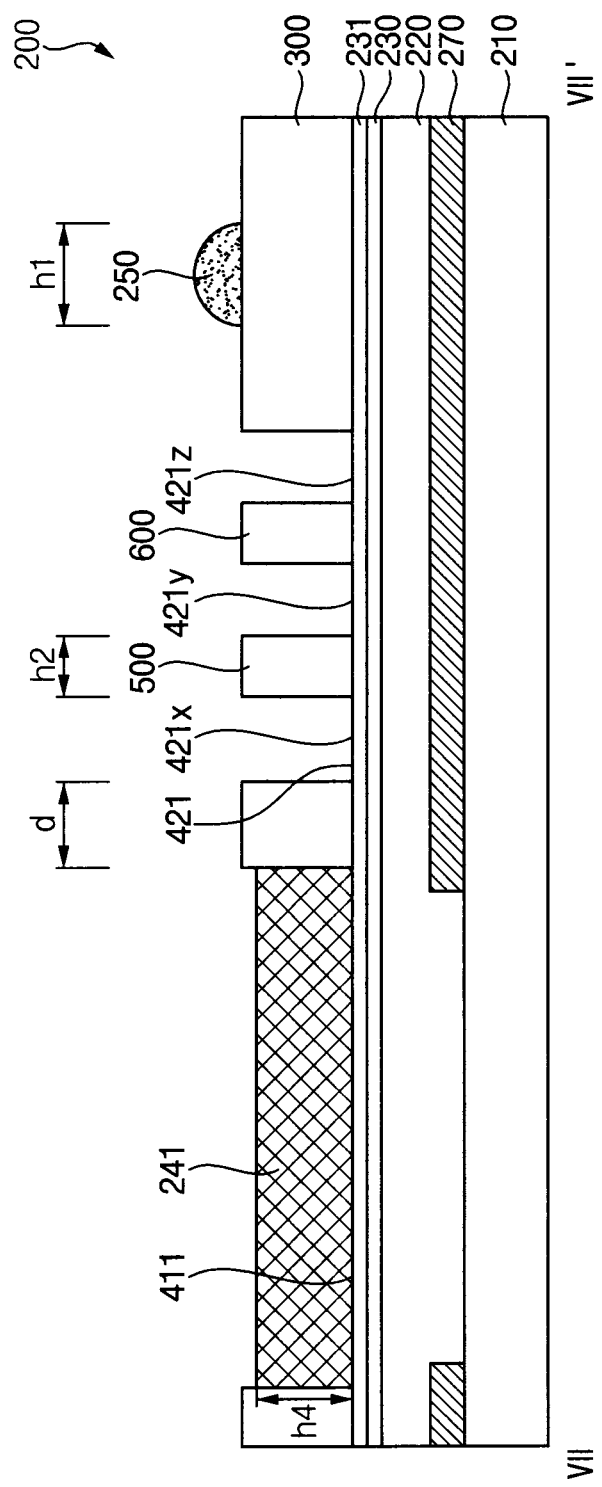
FIG. 17 is a cross-sectional view taken along line VII-VII' of FIG. 16.

FIG. 16 is a plan view illustrating a method of manufacturing a color conversion substrate according to an embodiment of the present invention. FIG. 17 is a cross-sectional view taken along line VII-VII' of FIG. 16.

Referring to FIGS. 16 and 17, a spacer 250 may be formed on the bank 300. In an embodiment, the spacer 250 may be formed to be spaced apart from the second opening area 423 adjacent to the transmission layer 243 in the second direction D2. However, in the embodiments of the present invention, a position of the spacer 250 is not limited thereto.

A width d of the bank 300 formed between the first opening area 411 and the second opening area 421 may be formed smaller than a width h1 of the spacer 250. Specifically, the width d of the bank 300 may be formed to be about 10 micrometers or more to about 25 micrometers or less. The width h1 of the spacer 250 may be formed to be about 30 micrometers or more to about 45 micrometers or less. When the width d of the bank 300 disposed between the first opening area 411 and the second opening area 421 is excessively large, during combining the color conversion substrate 200 and the array substrate 100, a defect may occur due to a protrusion formed by the ink misplaced on the bank 300. When the width d of the bank 300 in the second direction D2 is smaller than the width h1 of the spacer 250, a size of the protrusion formed from the misplaced ink on the bank 300 may be decreased by increasing an amount of the ink which is misplaced on the bank 300 flowing into the plurality of sub-opening areas 421x, 421y, 421z.

The width h2 of each of the first partition wall 500 and the second partition wall 600 may be formed to be smaller than the width h1 of the spacer 250. Specifically, the width h2 of the first partition wall 500 and the second partition wall 600 may be about 10 micrometers or more to about 25 micrometers or less. The width h1 of the spacer 250 may be about 30 micrometers or more to about 45 micrometers or less. When the width h2 of each of the first partition wall 500 and the second partition wall 600 is excessively large, during combining the color conversion substrate 200 and the array substrate 100, the defect may occur due to a protrusion formed by the ink misplaced on the first partition wall 500 and the second partition wall 600. When the width d of each of the first partition wall 500 and the second partition wall 600 in the second direction D2 is smaller than the width h1 of the spacer 250, a size of the protrusion formed from the misplaced ink may be decreased by increasing an amount of the ink flowing into the plurality of sub-opening areas 421x, 421y, 421z.

The color conversion substrate 200 according to an embodiment may include the second opening area 421, and the second opening area 421 may be divided into the plurality of sub-opening areas 421x, 421y, 421z, so that a defect caused by misplacement of the ink may be effectively prevented. In addition, even when the bank 300 is lost, dark spots due to a decrease in the thickness h4 of the color conversion unit 240 may be prevented.

The color conversion substrate according to the embodiments of the present invention may be applied to a display device included in a computer, a notebook, a mobile phone, a smartphone, a smart pad, a PMP, a PDA, an MP3 player, or the like.

Although the color conversion substrates and the display devices according to the embodiments have been described with reference to the drawings, the illustrated embodiments are examples, and may be modified and changed by a person having ordinary knowledge in the relevant technical field without departing from the technical spirit described in the following claims.

What is claimed is:

1. A color conversion substrate comprising:
a bank defining a first opening area and a second opening area;
a conversion part disposed in the first opening area, but not disposed in the second opening area, and including a color conversion particle; and
a partition wall disposed in the second opening area and dividing the second opening area into a plurality of sub-opening areas,
wherein each of the plurality of sub-opening areas has a volume smaller than a volume of the first opening area.

2. The color conversion substrate of claim 1, wherein the partition wall includes a same material as the bank.

3. The color conversion substrate of claim 1, wherein the second opening area is adjacent to a first surface of the first opening area.

4. The color conversion substrate of claim 1, wherein the partition wall has a shape of one of a straight shape, a curved shape, and a bent shape.

5. The color conversion substrate of claim 1, wherein the partition wall includes a first partition wall and a second partition wall.

6. The color conversion substrate of claim 5, wherein the first partition wall and the second partition wall have straight shapes and
wherein the first partition wall and the second partition wall extend in a first direction, and are spaced apart from each other in a second direction perpendicular to the first direction.

7. The color conversion substrate of claim 5, wherein the first partition wall and the second partition wall have straight shapes, and
wherein the first partition wall and the second partition wall cross each other.

8. The color conversion substrate of claim 5, wherein the first partition wall and the second partition wall have curved shapes, and
wherein the first partition wall is adjacent to a first surface of the second opening area, and the second partition wall is adjacent to a second surface opposite to the first surface.

9. The color conversion substrate of claim 1, wherein the partition wall is arranged in a lattice structure.

10. The color conversion substrate of claim 1, further comprising:
a spacer disposed on the bank.

11. The color conversion substrate of claim 10, wherein a portion of the bank disposed between the first opening area and the second opening area has a width smaller than a width of the spacer.

12. The color conversion substrate of claim 10, wherein the partition wall has a width smaller than a width of the spacer.

13. A display device comprising:
a color conversion substrate including a bank, a color conversion unit and a partition wall, wherein the bank defines a first opening area and a second opening area, the color conversion unit is disposed in the first opening area and includes a color conversion particle, and the partition wall is disposed in the second opening area and divides the second opening area into a plurality of sub-opening areas; and
an array substrate coupled to the color conversion substrate, and including a light emitting diode which provides a light to the color conversion substrate,
wherein each of the plurality of sub-opening areas has a volume smaller than a volume of the first opening area.

14. The display device of claim 13, wherein the partition wall includes a first partition wall and a second partition wall,
wherein the first partition wall and the second partition wall have straight shapes, and
wherein the first partition wall and the second partition wall extend in a first direction, and are spaced apart from each other in a second direction perpendicular to the first direction.

15. The display device of claim 13, further comprising:
a spacer disposed on the bank, and
wherein a portion of the bank disposed between the first opening area and the second opening area has a width smaller than a width of the spacer.

16. The display device of claim 15, wherein the partition wall has a width smaller than the width of the spacer.

17. A method of manufacturing a color conversion substrate, the method comprising:
forming a bank with a partition wall, wherein the bank defines a first opening area and a second opening area adjacent to the first opening area, the partition wall is disposed in the second opening area and divides the second opening area into a plurality of sub-opening areas;
providing an ink in the first opening area, but not in the second opening area; and
forming a color conversion unit by curing the ink,
wherein each of the plurality of sub-opening areas has a volume smaller than a volume of the first opening area.

18. The method of claim 17, wherein the partition wall includes a first partition wall and a second partition wall, and
wherein the first partition wall and the second partition wall each has a shape of one of a straight shape, a curved shape, and a bent shape.

19. The method of claim 17, wherein the color conversion unit is formed by an inkjet process.

20. The method of claim 17, further comprising:
forming a spacer on the bank,
wherein a width of a portion of the bank formed between the first opening area and the second opening area is smaller than a width of the spacer.

* * * * *